(12) United States Patent
Karczewicz et al.

(10) Patent No.: US 9,264,706 B2
(45) Date of Patent: Feb. 16, 2016

(54) BYPASS BINS FOR REFERENCE INDEX CODING IN VIDEO CODING

(71) Applicant: QUALCOMM Incorporated, San Diego, CA (US)

(72) Inventors: Marta Karczewicz, San Diego, CA (US); Vadim Seregin, San Diego, CA (US); Xianglin Wang, San Diego, CA (US); Muhammed Zeyd Coban, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 407 days.

(21) Appl. No.: 13/828,173

(22) Filed: Mar. 14, 2013

(65) Prior Publication Data

US 2013/0272377 A1 Oct. 17, 2013

Related U.S. Application Data

(60) Provisional application No. 61/623,043, filed on Apr. 11, 2012, provisional application No. 61/637,218, filed on Apr. 23, 2012, provisional application No. 61/640,568, filed on Apr. 30, 2012, provisional application No. 61/647,422, filed on May 15, 2012, provisional application No. 61/665,151, filed on Jun. 27, 2012.

(51) Int. Cl.
*H04N 19/70* (2014.01)
*H04N 19/13* (2014.01)
*H04N 19/463* (2014.01)
*H04N 19/103* (2014.01)
*H03M 7/30* (2006.01)

(52) U.S. Cl.
CPC .......... *H04N 19/00018* (2013.01); *H03M 7/30* (2013.01); *H04N 19/13* (2014.11); *H04N 19/463* (2014.11); *H04N 19/70* (2014.11)

(58) Field of Classification Search
None
See application file for complete search history.

(56) References Cited

U.S. PATENT DOCUMENTS

| | | | | |
|---|---|---|---|---|
| 7,088,271 | B2 * | 8/2006 | Marpe et al. | 341/107 |
| 7,469,070 | B2 * | 12/2008 | Winger | 382/239 |
| 7,630,440 | B2 | 12/2009 | Prakasam | |
| 7,894,523 | B2 * | 2/2011 | Jeon et al. | 375/240.12 |
| 7,983,343 | B2 * | 7/2011 | Pearson et al. | 375/240.25 |
| 8,094,048 | B2 | 1/2012 | Park et al. | |

(Continued)

OTHER PUBLICATIONS

Marpe, et al., "Context-Based Adaptive Binary Arithmetic Coding in the H.264/AVC Video Compression Standard," IEEE Trans. on Circuits and Systems for Video Technology, vol. 13, No. 7, Jul. 2003, pp. 620-636.*

(Continued)

*Primary Examiner* — Jay Patel
*Assistant Examiner* — Reza Aghevli
(74) *Attorney, Agent, or Firm* — Shumaker & Sieffert, P.A.

(57) ABSTRACT

In an example, aspects of this disclosure relate to a method for decoding a reference index syntax element in a video decoding process that includes decoding at least one bin of a reference index value with a context coding mode of a context-adaptive binary arithmetic coding (CABAC) process. The method also includes decoding, when the reference index value comprises more bins than the at least one bin coded with the context coded mode, at least another bin of the reference index value with a bypass coding mode of the CABAC process, and binarizing the reference index value.

91 Claims, 11 Drawing Sheets

(56) References Cited

U.S. PATENT DOCUMENTS

| | | | | |
|---|---|---|---|---|
| 8,212,696 B2* | 7/2012 | Chang et al. | | 341/107 |
| 2005/0169374 A1* | 8/2005 | Marpe et al. | | 375/240.16 |
| 2006/0294174 A1* | 12/2006 | Haque et al. | | 708/490 |
| 2010/0020876 A1* | 1/2010 | Jeon et al. | | 375/240.16 |
| 2013/0003829 A1* | 1/2013 | Misra et al. | | 375/240.12 |

OTHER PUBLICATIONS

Karwowski et al., "Improved Context-Based Adaptive Binary Arithmetic Coding in MPEG-4 AVC/H.264 Video Codec," Springer, LNCS vol. 6375, 2010, pp. 25-32.*
Kim et al., "High Speed Decoding of Context-based Adaptive Binary Arithmetic Codes Using Most Probable Symbol Prediction," 2006 IEEE Int'l Symposium on Circuits and Systems—ISCAS 2006, May 21-24, 2006, pp. 1707-1710.*
Bross et al., "High efficiency video coding (HEVC) text specification draft 10 (For FDIS & Last Call)," 12th Meeting: Geneva, CH, Jan. 14-23, 2013, JCTVC-L1003_v34, 310 pp.
Bross et al., "High efficiency video coding (HEVC) text specification draft 6," 8th Meeting: San Jose, CA, USA, Feb. 1-10, 2012, JCTVC-H1003, 259 pp.
Bross et al., "High efficiency video coding (HEVC) text specification draft 7," 9th Meeting: Geneva, CH, Apr. 27-May 7, 2012, JCTVC-I1003_d2, 290 pp.
Bross et al., "High efficiency video coding (HEVC) text specification draft 8," 10th Meeting: Stockholm, SE, Jul. 11-20, 2012, JCTVC-J1003_d7, 261 pp.
Bross et al., "High efficiency video coding (HEVC) text specification draft 9," 11th Meeting: Shanghai, CN, Oct. 10-19, 2012, JCTVC-K1003_v7, 290 pp.
Bross et al., "WD4: Working Draft 4 of High-Efficiency Video Coding," 6th Meeting: JCTVC-F803_d2, Torino, IT, Jul. 14-22, 2011, 226 pp.
Bross et al., "WD5: Working Draft 5 of High-Efficiency Video Coding," 7th Meeting: Geneva, Switzerland, Nov. 21-30, 2011, JCTVC-G1103_d2, 214 pp.
International Search Report and Written Opinion—PCT/US2013/034968—ISA/EPO—Jun. 17, 2013, 9 pp.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Lee T., et al., "On Reference List Combination," 9th Meeting, Geneva, CH, Docket: JCTVC-I0125, Apr. 27-May 7, 2012, 11 pp.
Marpe et al., "Contetxt-Based Adaptive Binary Arithmetic Coding in the H.264/AVC Video Compression Standard", IEEE Transactions on Circuits and Systems for Video Technology, IEEE Service Center, Piscataway, NJ, US, vol. 13, No. 7, Jul. 1, 2003, pp. 620-636, XP002509017, ISSN: 1051-8215, DOI: 10.1109/TCSVT.2003.815173.
Second Written Opinion from International Application No. PCT/US2013/034968, dated Mar. 10, 2014, 5 pp.
Wiegand et al., "WD1: Working Draft 1 of High-Efficiency Video Coding", JCTVC-C403, 3rd Meeting: Guangzhou, CN, Oct. 7-15, 2010, 137 pp.
Wiegand et al., "WD2: Working Draft 2 of High-Efficiency Video Coding," JCTVC-D503, 4th Meeting: Daegu, KR, Jan. 20-28, 2011, 153 pp.
Wiegand et al., "WD3: Working Draft 3 of High-Efficiency Video Coding," Document JCTVC-E603, 5th Meeting: Geneva, CH, Mar. 16-23, 2011, 193 pp.
International Preliminary Report on Patentability—PCT/US2013/034968—The International Bureau of WIPO Geneva Switzerland May 20, 2014.
Reply to Written Opinion mailed Jun. 17, 2013, from international application No. PCT/US2013/034968, dated Feb. 4, 2014, 11 pp.
Reply to Second Written Opinion mailed Mar. 10, 2014, from international application No. PCT/US2013/034968, dated May 8, 2014, 6 pp.
ITU-T H.265, Series H: Audiovisual and Multimedia Systems, Infrastructure of audiovisual services—Coding of moving video, High efficiency video coding, The International Telecommunication Union, Apr. 2013, 317 pp.
Sze, et al., "Reduction in context coded bins for ref_idx and cu_qp_delta", JCT-VC Meeting; MPEG Meeting; Apr. 27, 2012-Jul. 5, 2012; Geneva; (Joint Collaborative Team on Video Coding of ISO/IEC JTC1/SC29/WG11 and ITU-T SG.16); URL: http://wftp3.itu.int/av-arch/jctvc-site/, No. JCTVC-I0204, XP030111967, 5 pp.
Taiwan Office Action and Search Report with translation—TW102112895—TIPO—Jul. 29, 2015 (16 pages).

* cited by examiner

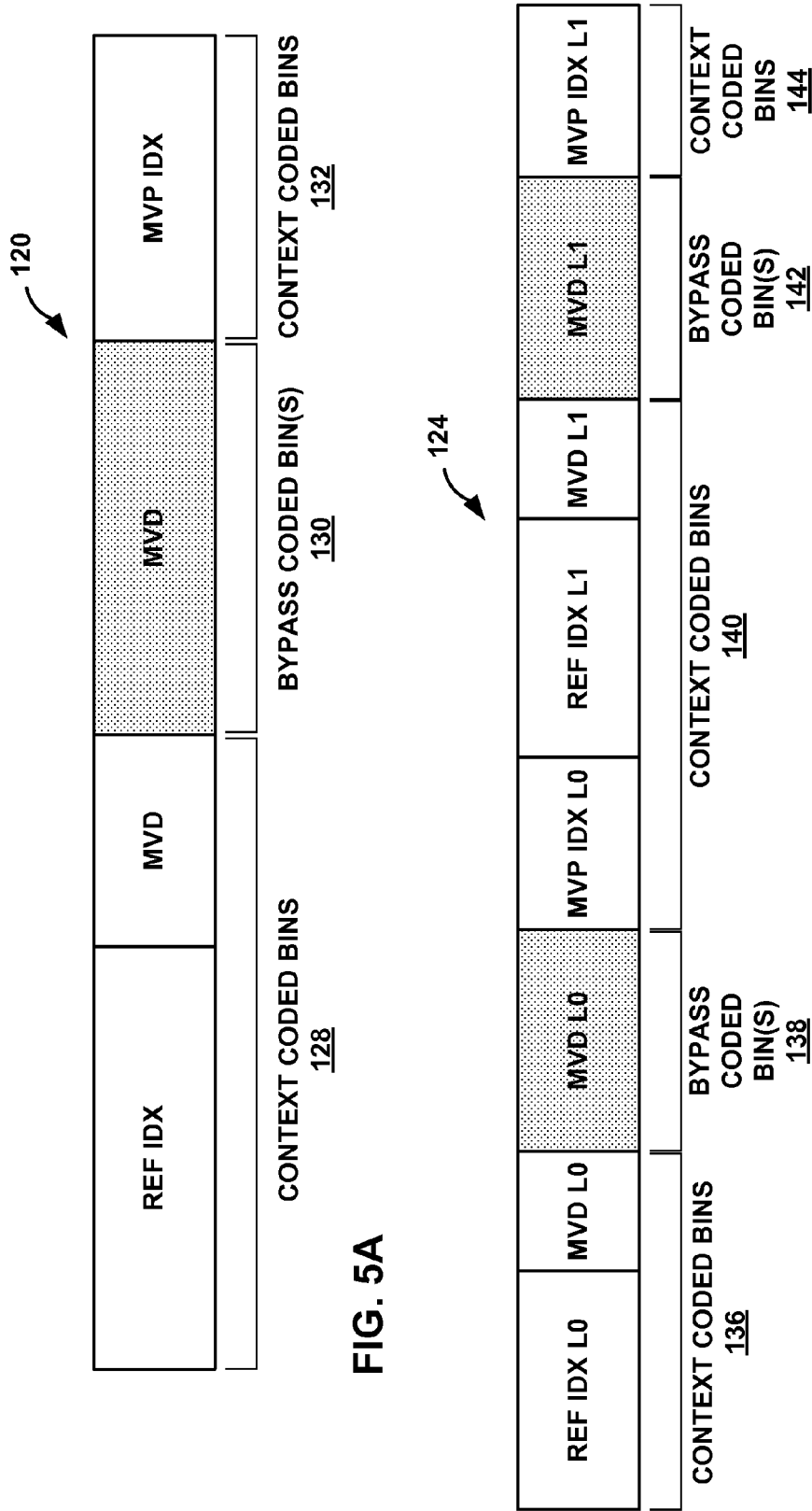

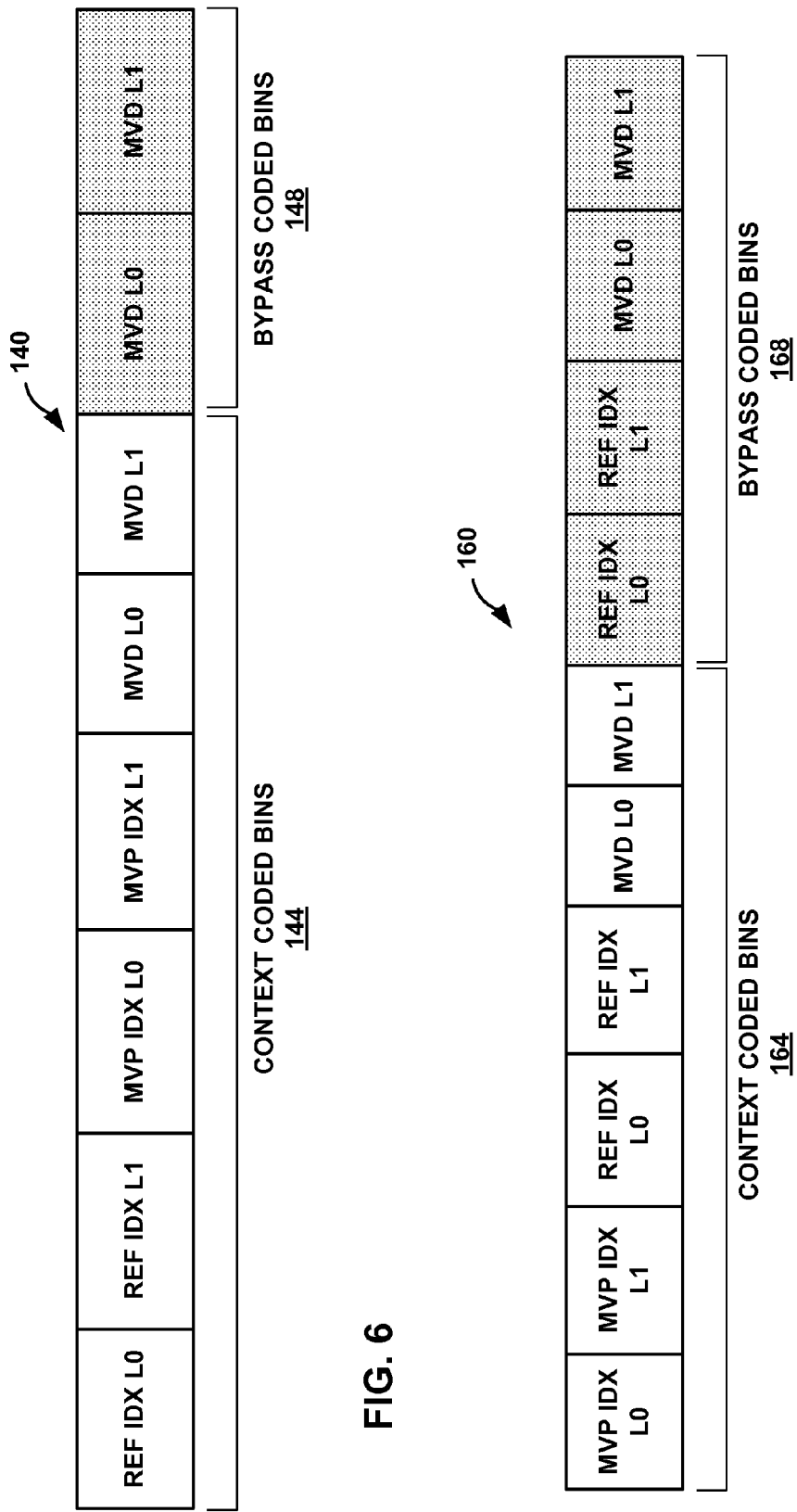

BYPASS BINS FOR REFERENCE INDEX CODING IN VIDEO CODING

This disclosure claims benefit of U.S. Provisional Application No. 61/623,043, filed 11 Apr. 2012, U.S. Provisional Application 61/637,218, filed 23 Apr. 2012, U.S. Provisional Application 61/640,568, filed 30 Apr. 2012, U.S. Provisional Application 61/647,422 filed 15 May 2012, and U.S. Provisional Application No. 61/665,151, filed 27 Jun. 2012, the contents of each of which are hereby incorporated by reference in their entirety.

TECHNICAL FIELD

This disclosure relates to video coding, and more particularly to techniques for coding syntax elements in a video coding process.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, digital cameras, digital recording devices, digital media players, video gaming devices, video game consoles, cellular or satellite radio telephones, video teleconferencing devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards, to transmit, receive and store digital video information more efficiently.

Video compression techniques include spatial prediction and/or temporal prediction to reduce or remove redundancy inherent in video sequences. For block-based video coding, a video frame or slice may be partitioned into blocks. A video frame alternatively may be referred to as a picture. Each block can be further partitioned. Blocks in an intra-coded (I) picture or slice are encoded using spatial prediction with respect to reference samples in neighboring blocks in the same picture or slice. Blocks in an inter-coded (P or B) picture or slice may use spatial prediction with respect to reference samples in neighboring blocks in the same picture or slice or temporal prediction with respect to reference samples in other reference pictures. Spatial or temporal prediction results in a predictive block for a block to be coded. Residual data represents pixel differences between the original block to be coded and the predictive block.

An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in a particular order to produce a one-dimensional vector of transform coefficients for entropy coding. Entropy coding also may be applied to a variety of other syntax elements used in the video coding process.

SUMMARY

The techniques of this disclosure generally relate to entropy coding video data. For example, when performing context adaptive coding, a video coder may code each bit or "bin" of data using probability estimates, which may indicate a likelihood of a bin having a given binary value. The probability estimates may be included within a probability model, also referred to as a "context model." A video coder may select a context model by determining a context for the bin. Context for a bin may include values of related bins of previously coded syntax elements. After coding the bin, the video coder may update the context model based on a value of the bin to reflect the most current probability estimates. In contrast to applying a context coding mode, a video coder may apply a bypass coding mode. For example, the video coder may use a bypass mode to bypass, or omit, the regular arithmetic coding process. In such instances, a video coder may use a fixed probability model (that is not updated during coding) to bypass code the bins.

The techniques of this disclosure relate to efficiently context coding syntax elements associated with inter-coded video data. For example, aspects of this disclosure relate to efficiently coding reference index values, motion vector predictors, motion vector difference values, and the like. In some instances, a video coder may perform context coding for some bins of a syntax element and bypass coding for other bins of the syntax element. For example, the video coder may context code one or more bins of a reference index value and bypass code one or more other bins of the reference index value.

In an example, aspects of this disclosure relate to a method for encoding a reference index syntax element in a video encoding process that includes binarizing a reference index value, encoding at least one bin of the binarized reference index value with a context coding mode of a context-adaptive binary arithmetic coding (CABAC) process, and encoding, when the binarized reference index value comprises more bins than the at least one bin coded with the context coded mode, at least another bin of the binarized reference index value with a bypass coding mode of the CABAC process.

In another example, aspects of this disclosure relate to an apparatus for encoding a reference index syntax element in a video encoding process that includes one or more processors to binarize a reference index value, encode at least one bin of the binarized reference index value with a context coding mode of a context-adaptive binary arithmetic coding (CABAC) process, and encode, when the binarized reference index value comprises more bins than the at least one bin coded with the context coded mode, at least another bin of the binarized reference index value with a bypass coding mode of the CABAC process.

In another example, aspects of this disclosure relate to an apparatus for encoding a reference index syntax element in a video encoding process that includes means for binarizing a reference index value, means for encoding at least one bin of the binarized reference index value with a context coding mode of a context-adaptive binary arithmetic coding (CABAC) process, and means for encoding, when the binarized reference index value comprises more bins than the at least one bin coded with the context coded mode, at least another bin of the binarized reference index value with a bypass coding mode of the CABAC process.

In another example, aspects of this disclosure relate to a method for decoding a reference index syntax element in a video decoding process that includes decoding at least one bin of a reference index value with a context coding mode of a context-adaptive binary arithmetic coding (CABAC) process, decoding, when the reference index value comprises more bins than the at least one bin coded with the context coded mode, at least another bin of the reference index value with a bypass coding mode of the CABAC process, and binarizing the reference index value.

In another example, aspects of this disclosure relate to an apparatus for decoding a reference index syntax element in a video decoding process that includes one or more processors configured to decode at least one bin of a reference index value with a context coding mode of a context-adaptive binary arithmetic coding (CABAC) process, decode, when the reference index value comprises more bins than the at least one bin coded with the context coded mode, at least another bin of the reference index value with a bypass coding mode of the CABAC process, and binarize the reference index value.

In another example, aspects of this disclosure relate to a non-transitory computer-readable medium storing instructions thereon that, when executed cause one or more processors to decode at least one bin of a reference index value with a context coding mode of a context-adaptive binary arithmetic coding (CABAC) process, decode, when the reference index value comprises more bins than the at least one bin coded with the context coded mode, at least another bin of the reference index value with a bypass coding mode of the CABAC process, and binarize the reference index value.

The details of one or more examples are set forth in the accompanying drawings and the description below. Other features, objects, and advantages will be apparent from the description and drawings, and from the claims.

BRIEF DESCRIPTION OF DRAWINGS

FIG. 5A is a block diagram illustrating an example string of prediction data.

FIG. 5B is a block diagram illustrating another example string of prediction data.

FIG. 6 is a block diagram illustrating another example string of prediction data.

FIG. 7 is a block diagram illustrating another example string of prediction data.

DETAILED DESCRIPTION

Figure 1:
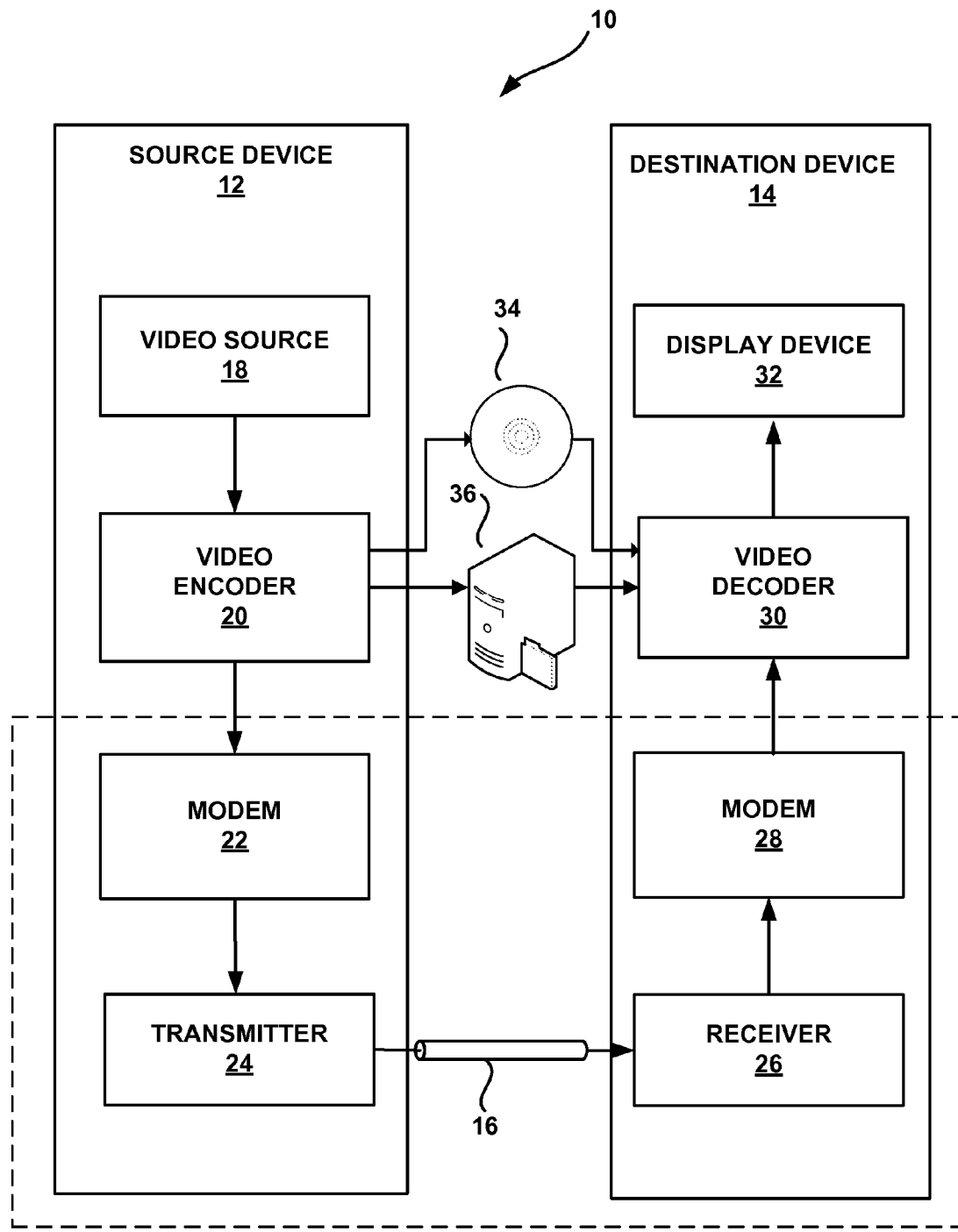
FIG. 1 is a block diagram illustrating an example video encoding and decoding system.

A video coding device may compress video data by taking advantage of spatial and temporal redundancy. For example, a video encoder may take advantage of spatial redundancy by coding a block relative to neighboring, previously coded blocks. Likewise, a video encoder may take advantage of temporal redundancy by coding a block relative to data of previously coded pictures. In particular, the video encoder may predict a current block from data of a spatial neighbor (referred to as intra-coding) or from data of one or more other pictures (referred to as inter-coding). The video encoder may then calculate a residual for the block as a difference between the actual pixel values for the block and the predicted pixel values for the block. Accordingly, the residual for a block may include pixel-by-pixel difference values in the pixel (or spatial) domain.

A video coder may perform motion estimation and motion compensation when inter-predicting a block of video data. For example, motion estimation is performed at a video encoder and includes calculating one or more motion vectors. A motion vector may indicate the displacement of a block of video data in a current picture relative to a reference sample of a reference picture. A reference sample may be a block that is found to closely match the block being coded in terms of pixel difference, which may be determined by sum of absolute difference (SAD), sum of squared difference (SSD), or other difference metrics. The reference sample may occur anywhere within a reference picture or reference slice, and not necessarily at a block boundary of the reference picture or slice. In some examples, the reference sample may occur at a fractional pixel position.

Data defining the motion vector may describe, for example, a horizontal component of the motion vector, a vertical component of the motion vector, a resolution for the motion vector (e.g., one-quarter pixel precision or one-eighth pixel precision), a reference picture to which the motion vector points, and/or a reference picture list (e.g., list 0 (L0), list 1 (L1) or a combined list (LC)) for the motion vector, e.g., as indicated by a prediction direction. A reference index (ref_idx) may identify the particular picture in the reference picture list to which the motion vector points. In this manner, the ref_idx syntax element serves as an index into a reference picture list, e.g., L0, L1 or LC.

Upon identifying a reference block, the difference between the original video data block and the reference block is determined. This difference may be referred to as the prediction residual data, and indicates the pixel differences between the pixel values in the block to the coded and the pixel values in the reference block selected to represent the coded block. To achieve better compression, the prediction residual data may be transformed, e.g., using a discrete cosine transform (DCT), an integer transform, a Karhunen-Loeve (K-L) transform, or another transform. For further compression, the transform coefficients may be quantized.

An entropy coder then entropy encodes symbols or syntax elements associated with a block of video data and the quantized transform coefficients. Examples of entropy coding schemes include Context Adaptive Variable Length Coding (CAVLC), Context Adaptive Binary Arithmetic Coding (CABAC), Probability Interval Partitioning Entropy Coding (PIPE), or the like. Prior to context coding, a video encoder may convert an absolute value of each value being coded into binarized form. In this way, each non-zero value being coded may be "binarized," e.g., using a unary coding table or other coding scheme that converts a value to a codeword having one or more bits, or "bins."

With respect to CABAC, as an example, a video coder may select a probability model (also referred to as a context model) to code symbols associated with a block of video data. For example, at the encoder, a target symbol may be coded by using the probability model. At the decoder, a target symbol may be parsed by using the probability model. In some instances, bins may be coded using a combination of context adaptive and non-context adaptive coding. For example, a video coder may use a bypass mode to bypass, or omit, the regular arithmetic coding process for one or more bins, while using context adaptive coding for other bins. In such examples, the video coder may use a fixed probability model to bypass code the bins. That is, bypass coded bins do not include context or probability updates. In general, as described in greater detail with respect to FIG. 4 below, context coding bins may be referred to as coding the bins using a context coding mode. Likewise, bypass coding bins may be referred to as coding the bins using a bypass coding mode.

A context model for coding a bin of a syntax element may be based on values of related bins of previously coded neighboring syntax elements. As one example, a context model for coding a bin of a current syntax element may be based on values of related bins of previously coded neighboring syntax elements, e.g., on the top and to the left of the current syntax element. The positions from which context is derived may be referred to as a context support neighborhood (also referred to as "context support", or simply "support"). For example, with respect to coding the bins of a significance map (e.g., indicating the locations of non-zero transform coefficients in a block of video data), a five point support may be is used to define a context model.

In some examples, a context model (Ctx) may be an index or offset that is applied to select one of a plurality of different contexts, each of which may correspond to a particular probability model. Hence, in any case, a different probability model is typically defined for each context. After coding the bin, the probability model is further updated based on a value of the bin to reflect the most current probability estimates for the bin. For example, a probability model may be maintained as a state in a finite state machine. Each particular state may correspond to a specific probability value. The next state, which corresponds to an update of the probability model, may depend on the value of the current bin (e.g., the bin currently being coded). Accordingly, the selection of a probability model may be influenced by the values of the previously coded bins, because the values indicate, at least in part, the probability of the bin having a given value. The context coding process described above may generally be referred to as a context-adaptive coding mode.

The probability updating process described above may delay into the coding process. For example, assume two bins use the same context model (e.g., ctx(0)) for purposes of context adaptive coding. In this example, a first bin may use ctx(0) to determine a probability model for coding. The value of the first bin influences the probability model associated with ctx(0). Accordingly, a probability update must be performed prior to coding the second bin with ctx(0). In this way, the probability update may introduce delay into the coding cycle.

With respect to video coding, as another example, a video coder may context adaptively code a sequence of bins (e.g., bin(0), bin(1), . . . bin(n)) of a reference index (ref_idx). As noted above, a reference index (ref_idx) may identify the particular picture in the reference picture list to which the motion vector points. A single reference index (ref_idx) may include, for example, up to 15 bins. Assume for purposes of explanation that the video coder derives three contexts for coding the bins and applies the contexts based on the bin number being coded (e.g., indicated using context indexes ctx(0), ctx(1), and ctx(2)). That is, in this example, the video coder may use ctx(0) to code bin (0), ctx(1) to code bin(1), and ctx(2) to code the remaining bins (e.g, bin(2) through bin(n)).

In the example described above, the third context (ctx(2)) is shared among a number of bins (e.g., up to 13 bins). Using the same probability model to code bin (2) through bin(n) in this way may create a delay between successive coding cycles. For example, as noted above, repeatedly calling the same context and waiting to update the model after each bin may present a bottleneck for the throughput of the coder.

Moreover, the correlation between bin(2) and bin(n) may not be sufficient to warrant the time and computational resources associated with updating the probability model. That is, one potential benefit of context adaptive coding is the ability to adapt a probability model based on previously coded bins (given the same context). If the value of a first bin, however, has little relation to, or bearing on the value of a subsequent bin, there may be little efficiency gain associated with the probability update. Accordingly, bins exhibiting a low correlation may not benefit from context adaptive coding as much as bins having relatively higher correlations.

Aspects of this disclosure relate to efficiently context coding syntax elements associated with inter-coded video data. For example, aspects of this disclosure relate to efficiently coding reference index values, motion vector predictors, motion vector difference values, and the like. In some examples, a video coder may perform context coding for some bins of a syntax element and bypass coding for other bins of the syntax element.

With specific reference to the reference index coding example described above, according to aspects of this disclosure, the video coder may apply ctx(0) to bin(0), ctx(1) to bin(1), ctx(2) to bin(2) and may bypass code the remaining bins of the reference index value with no contexts required. In other words, the video coder may use ctx(2) as the context for CABAC coding bin(2) of a binarized reference index value, but may bypass code any bins that follow bin(2).

Given that reference index values may be 15 bins or more in length, limiting the number of bins that are context coded in this way may produce a computational and/or time savings versus context coding all of the reference index bins. Moreover, as noted above, the correlation between bits of a reference index value may not be high (e.g., the value of bin(3) of the reference index value may not provide a useful indication regarding the likelihood of bin(4) having a value of a "1" or a "0"), which reduces the benefit of context coding. Accordingly, the amount of time and computational resources saved by context coding fewer bins of a reference index value may outweigh the coding efficiency gains associated with context coding all bins of the reference index value.

Other aspects of this disclosure generally relate to grouping context coded bins and non-context coded bins during coding. For example, as noted above, some syntax elements may be coded using a combination of context coding and bypass coding. That is, some syntax elements may have one or more bins that are context coded and one or more other bins that are bypass coded.

Assume, for purposes of example, that two syntax elements each have a context coded portion (including one or more context coded bins) and a bypass coded portion (including one or more bypass coded bins). In this example, the video coder may code the context coded portion of the first syntax element, followed by the bypass coded portion of the first syntax element, followed by the context coded portion of the second syntax element, followed by the bypass coded portion of the second syntax element.

In the example described above, a video coder may switch between a context coding mode and a bypass coding mode three times to code the two syntax elements. For example, the video coder switches between context coding and bypass coding after the context coded bins of the first syntax element, after the bypass coded bins of the first syntax element, and after the context coded bins of the second syntax element. Switching between context coding and bypass coding in this way may be computationally inefficient. For example, switching between context coding and bypass coding may consume one or more clock cycles. Accordingly, switching between context coding and bypass coding for each element may introduce latency, due to the transitions between context coding and bypass coding.

Aspects of this disclosure include grouping context coded bins and non-context coded bins (e.g., bypass bins) during coding. For example, with respect to the example described above, according to aspects of this disclosure, a video coder may code the context coded bins of the first syntax element, followed by the context coded bins of the second syntax element, followed by the bypass coded bins of the first syntax element, followed by the bypass coded bins of the second syntax element. Accordingly, the video coder only transitions between a context coding mode and a bypass coding mode a single time, e.g., between the context coded bins and the non-context coded bins.

Grouping bins in this manner may reduce the frequency with which a video coder switches between a context coding mode and a bypass coding mode. Accordingly, aspects of this disclosure may reduce latency when coding syntax elements that include a combination of context coded bins and bypass coded bins. In some examples, as described with respect to FIGS. 5-8 below, bins associated with prediction data may be grouped according to the techniques of this disclosure. For example, as described herein, prediction data may generally include data associated with inter-prediction. For example, prediction data may include data indicating reference index values, motion vectors, motion vector predictors, motion vector difference values, and the like.

FIG. 1 is a block diagram illustrating an example video encoding and decoding system 10 that may be configured to code prediction data in accordance with examples of this disclosure. As shown in FIG. 1, the system 10 includes a source device 12 that transmits encoded video to a destination device 14 via a communication channel 16. Encoded video data may also be stored on a storage medium 34 or a file server 36 and may be accessed by the destination device 14 as desired. When stored to a storage medium or file server, video encoder 20 may provide coded video data to another device, such as a network interface, a compact disc (CD), Blu-ray or digital video disc (DVD) burner or stamping facility device, or other devices, for storing the coded video data to the storage medium. Likewise, a device separate from video decoder 30, such as a network interface, CD or DVD reader, or the like, may retrieve coded video data from a storage medium and provided the retrieved data to video decoder 30.

The source device 12 and the destination device 14 may comprise any of a wide variety of devices, including desktop computers, notebook (i.e., laptop) computers, tablet computers, set-top boxes, telephone handsets such as so-called smartphones, televisions, cameras, display devices, digital media players, video gaming consoles, or the like. In many cases, such devices may be equipped for wireless communication. Hence, the communication channel 16 may comprise a wireless channel, a wired channel, or a combination of wireless and wired channels suitable for transmission of encoded video data. Similarly, the file server 36 may be accessed by the destination device 14 through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server.

Techniques for coding prediction data, in accordance with examples of this disclosure, may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, the system 10 may be configured to support one-way or two-way video transmission to support applications such as video streaming, video playback, video broadcasting, and/or video telephony.

In the example of FIG. 1, the source device 12 includes a video source 18, a video encoder 20, a modulator/demodulator 22 and a transmitter 24. In the source device 12, the video source 18 may include a source such as a video capture device, such as a video camera, a video archive containing previously captured video, a video feed interface to receive video from a video content provider, and/or a computer graphics system for generating computer graphics data as the source video, or a combination of such sources. As one example, if the video source 18 is a video camera, the source device 12 and the destination device 14 may form so-called camera phones or video phones. However, the techniques described in this disclosure may be applicable to video coding in general, and may be applied to wireless and/or wired applications, or application in which encoded video data is stored on a local disk.

The captured, pre-captured, or computer-generated video may be encoded by the video encoder 20. The encoded video information may be modulated by the modem 22 according to a communication standard, such as a wireless communication protocol, and transmitted to the destination device 14 via the transmitter 24. The modem 22 may include various mixers, filters, amplifiers or other components designed for signal modulation. The transmitter 24 may include circuits designed for transmitting data, including amplifiers, filters, and one or more antennas.

The captured, pre-captured, or computer-generated video that is encoded by the video encoder 20 may also be stored onto a storage medium 34 or a file server 36 for later consumption. The storage medium 34 may include Blu-ray discs, DVDs, CD-ROMs, flash memory, or any other suitable digital storage media for storing encoded video. The encoded video stored on the storage medium 34 may then be accessed by the destination device 14 for decoding and playback.

The file server 36 may be any type of server capable of storing encoded video and transmitting that encoded video to the destination device 14. Example file servers include a web server (e.g., for a website), an FTP server, network attached storage (NAS) devices, a local disk drive, or any other type of device capable of storing encoded video data and transmitting it to a destination device. The transmission of encoded video data from the file server 36 may be a streaming transmission, a download transmission, or a combination of both. The file server 36 may be accessed by the destination device 14 through any standard data connection, including an Internet connection. This may include a wireless channel (e.g., a Wi-Fi connection), a wired connection (e.g., DSL, cable modem, Ethernet, USB, etc.), or a combination of both that is suitable for accessing encoded video data stored on a file server.

The destination device 14, in the example of FIG. 1, includes a receiver 26, a modem 28, a video decoder 30, and a display device 32. The receiver 26 of the destination device 14 receives information over the channel 16, and the modem 28 demodulates the information to produce a demodulated bitstream for the video decoder 30. The information communicated over the channel 16 may include a variety of syntax information generated by the video encoder 20 for use by the video decoder 30 in decoding video data. Such syntax may also be included with the encoded video data stored on the storage medium 34 or the file server 36. Each of the video encoder 20 and the video decoder 30 may form part of a respective encoder-decoder (CODEC) that is capable of encoding or decoding video data.

The display device 32 may be integrated with, or external to, the destination device 14. In some examples, the destination device 14 may include an integrated display device and also be configured to interface with an external display device. In other examples, the destination device 14 may be a display device. In general, the display device 32 displays the decoded video data to a user, and may comprise any of a variety of display devices such as a liquid crystal display (LCD), a plasma display, an organic light emitting diode (OLED) display, or another type of display device.

In the example of FIG. 1, the communication channel 16 may comprise any wireless or wired communication medium, such as a radio frequency (RF) spectrum or one or more physical transmission lines, or any combination of wireless and wired media. The communication channel 16 may form part of a packet-based network, such as a local area network, a wide-area network, or a global network such as the Internet. The communication channel 16 generally represents any suitable communication medium, or collection of different communication media, for transmitting video data from the source device 12 to the destination device 14, including any suitable combination of wired or wireless media. The communication channel 16 may include routers, switches, base stations, or any other equipment that may be useful to facilitate communication from the source device 12 to the destination device 14.

The video encoder 20 and the video decoder 30 may operate according to a video compression standard, such as the High Efficiency Video Coding (HEVC) standard presently under development, and may conform to the HEVC Test Model (HM). Alternatively, the video encoder 20 and the video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples include MPEG-2 and ITU-T H.263.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder or decoder circuitry, as applicable, including a processor such as one or more microprocessors, digital signal processors (DSPs), special purpose processors or processing circuits, application specific integrated circuits (ASICs), field programmable gate arrays (FPGAs), fixed logic circuitry, discrete logic, software, hardware, firmware or any combinations thereof. Accordingly, the various units within video encoder 20 and video decoder 30 likewise may be implemented by any of a variety of such structural elements or combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

This disclosure may generally refer to video encoder 20 "signaling" certain information to another device, such as video decoder 30. It should be understood, however, that video encoder 20 may signal information by associating certain syntax elements with various encoded portions of video data. That is, video encoder 20 may "signal" data by storing certain syntax elements to headers of various encoded portions of video data. In some cases, such syntax elements may be encoded and stored (e.g., stored to storage device 32) prior to being received and decoded by video decoder 30. Thus, the term "signaling" may generally refer to the communication of syntax or other data for decoding compressed video data, whether such communication occurs in real- or near-real-time or over a span of time, such as might occur when storing syntax elements to a medium at the time of encoding, which then may be retrieved by a decoding device at any time after being stored to this medium.

As noted above, the JCT-VC is working on development of the HEVC standard. The HEVC standardization efforts are based on an evolving model of a video coding device referred to as the HEVC Test Model (HM). The HM presumes several additional capabilities of video coding devices relative to existing devices according to, e.g., ITU-T H.264/AVC. This disclosure typically uses the term "video block" to refer to a coding node of a CU. In some specific cases, this disclosure may also use the term "video block" to refer to a treeblock, i.e., LCU, or a CU, which includes a coding node and PUs and TUs.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may correspond to a coding node within a CU. The video blocks may have fixed or varying sizes, and may differ in size according to a specified coding standard.

As an example and as noted above, the HM supports prediction in various PU sizes (also referred to as PU types). Assuming that the size of a particular CU is 2N×2N, the HM supports intra-prediction in PU sizes of 2N×2N or N×N, and inter-prediction in symmetric PU sizes of 2N×2N, 2N×N, N×2N, or N×N. The HM also supports asymmetric partitioning for inter-prediction in PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2NxnU" refers to a 2N×2N CU that is partitioned horizontally with a 2N×0.5N PU on top and a 2N×1.5N PU on bottom. Other partitioning types are also possible.

In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a nonnegative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

Following intra-predictive or inter-predictive coding using the PUs of a CU, video encoder 20 may calculate residual data for the TUs of the CU. The PUs may comprise pixel data in the spatial domain (also referred to as the pixel domain) and the TUs may comprise coefficients in the transform domain following application of a transform, e.g., a discrete cosine transform (DCT), an integer transform, a wavelet transform, or a conceptually similar transform to residual video data. The residual data may correspond to pixel differences between pixels of the unencoded, original picture and prediction values corresponding to the PUs. Video encoder 20 may form the TUs including the residual data for the CU, and then transform the TUs to produce transform coefficients for the CU.

In some examples, as noted above, TUs may be defined according to an RQT. For example, an RQT may represent the manner in which transforms (e.g., DCT, integer transform, wavelet transform, or one or more other transforms) are applied to the residual luma samples and the residual chroma samples associated with a block of video data. That is, as noted above, residual samples corresponding to a CU may be subdivided into smaller units using an RQT. In general, the RQT is a recursive representation of the partitioning of a CU into TUs.

Following application of any transforms to residual data to produce transform coefficients, video encoder 20 may perform quantization of the transform coefficients. Quantization generally refers to a process in which transform coefficients are quantized to possibly reduce the amount of data used to represent the coefficients, providing further compression. The quantization process may reduce the bit depth associated with some or all of the coefficients. For example, an n-bit value may be rounded down to an m-bit value during quantization, where n is greater than m.

In some examples, video encoder 20 may utilize a predefined scan order to scan the quantized transform coefficients to produce a serialized vector that can be entropy encoded. In other examples, video encoder 20 may perform an adaptive scan. After scanning the quantized transform coefficients to form a one-dimensional vector, video encoder 20 may entropy encode the one-dimensional vector, e.g., according to context adaptive variable length coding (CAVLC), context adaptive binary arithmetic coding (CABAC), syntax-based context-adaptive binary arithmetic coding (SBAC), Probability Interval Partitioning Entropy (PIPE) coding or another entropy encoding methodology. Video encoder 20 may also entropy encode syntax elements associated with the encoded video data for use by video decoder 30 in decoding the video data. A current version of HEVC is designed to use CABAC for entropy coding.

In some examples, video encoder 20 may code syntax elements using a combination of context adaptive and non-context adaptive coding. For example, video encoder 20 may context code bins by selecting a probability model or "context model" that operates on context to code the bins. In contrast, video encoder 20 may bypass code bins by bypassing, or omitting the regular arithmetic coding process when coding the bins. In such examples, video encoder 20 may use a fixed probability model to bypass code the bins.

As noted above, the probability model updating process associated with context coding may introduce delay into the coding process. For example, video encoder 20 may context code a sequence of bins (e.g., bin(0), bin(1), ... bin(n)) of a reference index (ref_idx). A single reference index (ref_idx) may include, for example, up to 15 bins. Assume for purposes of explanation that video encoder 20 derives three contexts for coding the bins and applies the contexts based on the bin number being coded (e.g., indicated using context indexes ctx(0), ctx(1), and ctx(2)). That is, in this example, video encoder 20 may use ctx(0) to code bin (0), ctx(1) to code bin(1), and ctx(2) to code the remaining bins (e.g, bin(2) through bin(n)).

In the example described above, the third context (ctx(2)) is shared among a number of bins (e.g., up to 13 bins). Using the same probability model to code bin (2) through bin(n) in this way may create a delay between successive coding cycles. For example, repeatedly calling the same context and waiting to update the model after each bin may present a bottleneck for the throughput of the coder.

Moreover, the correlation between bin(2) and bin(n) may not be sufficient to warrant the time and computational resources associated with updating the probability model. That is, one potential benefit of context adaptive coding is the ability to adapt a probability model based on previously coded bins (given the same context). If the value of a first bin, however, has little relation to, or bearing on the value of a subsequent bin, there may be little efficiency gain associated with the probability update. Accordingly, bins exhibiting a low correlation may not benefit from context adaptive coding as much as bins having relatively higher correlations.

According to aspects of this disclosure, video encoder 20 may encode a reference index syntax element by coding at least one bin of a binarized reference index value with a context-adaptive binary arithmetic coding (CABAC) process, and by coding at least another bin of the binarized reference index value with a bypass coding mode of the context-adaptive binary arithmetic coding (CABAC) process.

In an example for purposes of illustration, video encoder 20 may apply ctx(0) to bin(0), ctx(1) to bin(1), ctx(2) to bin(2) and may bypass code the remaining bins of the reference index value with no contexts required. In other words, the video coder may use ctx(2) as the context for CABAC coding bin(2) of a binarized reference index value, but may bypass code any bins that follow bin(2).

Given that reference index values may be 15 bins or more in length, limiting the number of bins that are context coded in this way may produce a computational and/or time savings versus context coding all of the reference index bins. Moreover, as noted above, the correlation between bits of a reference index value may not be high (e.g., the value of bin(3) of the reference index value may not provide a useful indication regarding the likelihood of bin(4) having a value of a "1" or a "0"), which reduces the benefit of context coding. Accordingly, the amount of time and computational resources saved by context coding fewer bins of a reference index value may outweigh the coding efficiency gains associated with context coding all bins of the reference index value.

According to other aspects of this disclosure, video encoder 20 may group context coded bins and non-context coded bins during encoding. For example, as noted above, some syntax elements may be coded using a combination of context coding and bypass coding. That is, some syntax elements may have one or more bins that are context coded and one or more other bins that are bypass coded.

In some examples, video encoder 20 may switch between context coding and bypass coding to code a sequence of syntax elements. However, switching between context coding and bypass coding may consume one or more clock cycles. Accordingly, switching between context coding and bypass coding for each element may introduce latency, due to the transitions between context coding and bypass coding.

According to aspects of this disclosure, video encoder 20 may group context coded bins and non-context coded bins (e.g., bypass bins) during coding. For example, video encoder 20 may context code bins associated with more than one syntax element. Video encoder 20 may then bypass code bins associated with the more than one syntax element. In other examples, video encoder 20 may perform the bypass coding prior to the context coding. In any event, the techniques allow video encoder 20 to minimize transitions between context coding and bypass coding. Accordingly, aspects of this disclosure may reduce latency when coding syntax elements that include a combination of context coded bins and bypass coded bins.

Video decoder 30, upon receiving the coded video data, may perform a decoding pass generally reciprocal to the encoding pass described with respect to video encoder 20. For example, video decoder 30 may receive an encoded bitstream and decode the bitstream. According to aspects of this disclosure, for example, video decoder 30 may decode a reference index syntax element by coding at least one bin of a binarized reference index value with a context-adaptive binary arithmetic coding (CABAC) process, and by coding at least another bin of the binarized reference index value with a bypass coding mode of the context-adaptive binary arithmetic coding (CABAC) process.

According to other aspects of this disclosure, video decoder 30 may decode a bitstream having grouped context coded bins and non-context coded bins (e.g., bypass bins). For example, video decoder 30 may decode context coded bins associated with more than one syntax element. Video decoder 30 may then decode bypass coded bins associated with the more than one syntax element. In other examples, video decoder 30 may perform the bypass coding prior to the context coding (depending on the arrangement of bins in the bitstream being decoded). In any event, the techniques allow video decoder 30 to minimize transitions between context coding and bypass coding. Accordingly, aspects of this disclosure may reduce latency when coding syntax elements that include a combination of context coded bins and bypass coded bins.

Figure 2:
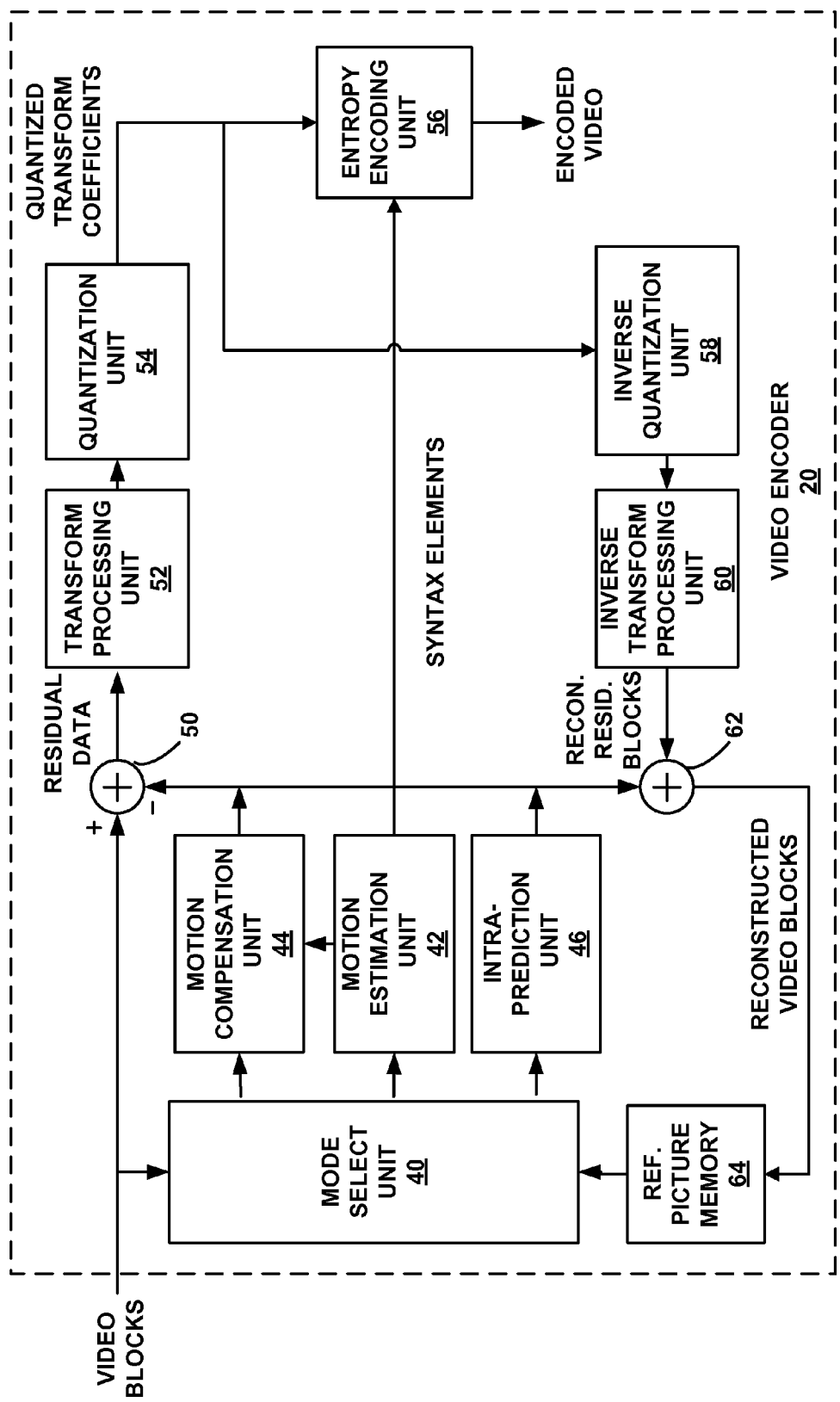
FIG. 2 is a block diagram illustrating an example video encoder.

FIG. 2 is a block diagram illustrating an example of a video encoder 20 that may use techniques for coding prediction data in accordance with examples of this disclosure. While aspects of video encoder 20 are described in the context of HEVC coding for purposes of illustration, the techniques of this disclosure are not limited to any particular coding standard or method that may require coding of prediction data.

Video encoder 20 may perform intra- and inter-coding of CUs within video pictures. Intra-coding relies on spatial prediction to reduce or remove spatial redundancy in video data within a given picture. Inter-coding relies on temporal prediction to reduce or remove temporal redundancy between a current picture and previously coded pictures of a video sequence. Intra-mode (I-mode) may refer to any of several spatial-based video compression modes. Inter-modes such as uni-directional prediction (P-mode) or bi-directional prediction (B-mode) may refer to any of several temporal-based video compression modes.

As shown in FIG. 2, video encoder 20 receives a current video block within a picture to be encoded. In the example of FIG. 2, video encoder 20 includes a motion compensation unit 44, a motion estimation unit 42, an intra-prediction unit 46, a reference picture memory 64, a summer 50, a transform processing unit 52, a quantization unit 54, and an entropy encoding unit 56. The transform processing unit 52 illustrated in FIG. 2 is the unit that applies the actual transform or combinations of transform to a block of residual data, and is not to be confused with a block of transform coefficients, which also may be referred to as a transform unit (TU) of a CU. For video block reconstruction, video encoder 20 also includes an inverse quantization unit 58, an inverse transform processing unit 60, and a summer 62. A deblocking filter (not shown in FIG. 2) may also be included to filter block boundaries to remove blockiness artifacts from reconstructed video. If desired, the deblocking filter would typically filter the output of summer 62.

During the encoding process, video encoder 20 receives a picture or slice to be coded. The picture or slice may be divided into multiple video blocks, e.g., largest coding units (LCUs). Motion estimation unit 42 and motion compensation unit 44 perform inter-predictive coding of the received video block relative to one or more blocks in one or more reference pictures to provide temporal compression. Intra-prediction unit 46 may perform intra-predictive coding of the received video block relative to one or more neighboring blocks in the same picture or slice as the block to be coded to provide spatial compression.

Mode select unit 40 may select one of the coding modes, intra or inter, e.g., based on error (i.e., distortion) results for each mode, and provides the resulting intra- or inter-predicted block (e.g., a prediction unit (PU)) to summer 50 to generate residual block data and to the summer 62 to reconstruct the encoded block for use in a reference picture. Summer 62 combines the predicted block with inverse quantized, inverse transformed data from inverse transform processing unit 60 for the block to reconstruct the encoded block, as described in greater detail below. Some pictures may be designated as I-frames, where all blocks in an I-frame are encoded in an intra-prediction mode. In some cases, the intra-prediction unit 46 may perform intra-prediction encoding of a block in a forward predicted picture (P-frame) or a bi-predicted picture (B-frame), e.g., when the motion search performed by motion estimation unit 42 does not result in a sufficient prediction of the block.

Motion estimation unit 42 and motion compensation unit 44 may be highly integrated, but are illustrated separately for conceptual purposes. Motion estimation (or motion search) is the process of generating motion vectors, which estimate motion for video blocks. A motion vector, for example, may indicate the displacement of a prediction unit in a current picture relative to a reference sample of a reference picture. Motion estimation unit 42 calculates a motion vector for a prediction unit of an inter-coded picture by comparing the prediction unit to reference samples of a reference picture stored in reference picture memory 64.

A predictive block (also referred to as a reference sample) is a block that is found to closely match the block to be coded, in terms of pixel difference, which may be determined by sum of absolute difference (SAD), sum of square difference (SSD), or other difference metrics. In some examples, video encoder 20 may calculate values for sub-integer pixel positions of reference pictures stored in reference picture memory 64, which may also be referred to as a reference picture buffer. For example, video encoder 20 may interpolate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. Accordingly, in general, data for a motion vector may include a reference picture list, an index into the reference picture list (ref_idx), a horizontal component, and a vertical component. The reference picture may be selected from a first reference picture list (List 0), a second reference picture list (List 1), or a combined reference picture list (List c), each of which identify one or more reference pictures stored in reference picture memory 64.

Motion estimation unit 42 may generate and send a motion vector that identifies the predictive block of the reference picture to entropy encoding unit 56 and motion compensation unit 44. That is, motion estimation unit 42 may generate and send motion vector data that identifies the reference picture list containing the predictive block, an index into the reference picture list identifying the picture of the predictive block, and a horizontal and vertical component to locate the predictive block within the identified picture.

In some examples, rather than sending the actual motion vector for a current PU, motion estimation unit 42 may predict the motion vector to further reduce the amount of data needed to communicate the motion vector. In this case, rather than encoding and communicating the motion vector itself, motion estimation unit 42 may generate a motion vector difference (MVD) relative to a known (or knowable) motion vector. The MVD may include a horizontal component and a vertical component corresponding to the horizontal component and the vertical component of the known motion vector. The known motion vector, which may be used with the MVD to define the current motion vector, can be defined by a so-called motion vector predictor (MVP). In general, to be a valid MVP, the motion vector being used for prediction must point to the same reference picture as the motion vector currently being coded.

When multiple motion vector predictor candidates are available (from multiple candidate blocks), motion estimation unit 42 may determine a motion vector predictor for a current block according to predetermined selection criteria. For example, motion estimation unit 42 may select the most accurate predictor from the candidate set based on analysis of encoding rate and distortion (e.g., using a rate-distortion cost analysis or other coding efficiency analysis). In other examples, motion estimation unit 42 may generate an average of the motion vector predictor candidates. Other methods of selecting a motion vector predictor are also possible.

Upon selecting a motion vector predictor, motion estimation unit 42 may determine a motion vector predictor index (mvp_flag), which may be used to inform a video decoder (e.g., such as video decoder 30) where to locate the MVP in a reference picture list containing MVP candidate blocks. Motion estimation unit 42 may also determine the MVD (horizontal component and vertical component) between the current block and the selected MVP. The MVP index and MVD may be used to reconstruct the motion vector.

In some examples, motion estimation unit 42 may instead implement a so-called "merge mode," in which motion estimation unit 42 may "merge" motion information (such as motion vectors, reference picture indexes, prediction directions, or other information) of predictive video block with a current video block. Accordingly, with respect to merge mode, a current video block inherits the motion information from another known (or knowable) video block. Motion estimation unit 42 may build a merge mode candidate list that includes several neighboring blocks in spatial and/or temporal directions as candidates for merge mode. Motion estimation unit 42 may determine an index value (e.g., merge_idx), which may be used to inform a video decoder (e.g., such as video decoder 30) where to locate the merging video block in a reference picture list containing merging candidate blocks.

Intra-prediction unit 46 may intra-predict the received block, as an alternative to inter-prediction performed by motion estimation unit 42 and motion compensation unit 44. Intra-prediction unit 46 may predict the received block relative to neighboring, previously coded blocks, e.g., blocks above, above and to the right, above and to the left, or to the left of the current block, assuming a left-to-right, top-to-bottom encoding order for blocks. Intra-prediction unit 46 may be configured with a variety of different intra-prediction modes. For example, intra-prediction unit 46 may be configured with a certain number of directional prediction modes, e.g., thirty-four directional prediction modes, based on the size of the CU being encoded.

Intra-prediction unit 46 may select an intra-prediction mode by, for example, calculating error values for various intra-prediction modes and selecting a mode that yields the lowest error value. Directional prediction modes may include functions for combining values of spatially neighboring pixels and applying the combined values to one or more pixel positions in a PU. Once values for all pixel positions in the PU have been calculated, intra-prediction unit 46 may calculate an error value for the prediction mode based on pixel differences between the PU and the received block to be encoded. Intra-prediction unit 46 may continue testing intra-prediction modes until an intra-prediction mode that yields an acceptable error value is discovered. The intra-prediction unit 46 may then send the PU to summer 50.

Video encoder 20 forms a residual block by subtracting the prediction data calculated by motion compensation unit 44 or the intra-prediction unit 46 from the original video block being coded. Summer 50 represents the component or components that perform this subtraction operation. The residual block may correspond to a two-dimensional matrix of pixel difference values, where the number of values in the residual block is the same as the number of pixels in the PU corresponding to the residual block. The values in the residual block may correspond to the differences, i.e., error, between values of co-located pixels in the PU and in the original block to be coded. The differences may be chroma or luma differences depending on the type of block that is coded.

Transform processing unit 52 may form one or more transform units (TUs) from the residual block. Transform processing unit 52 selects a transform from among a plurality of transforms. The transform may be selected based on one or more coding characteristics, such as block size, coding mode, or the like. Transform processing unit 52 then applies the selected transform to the TU, producing a video block comprising a two-dimensional array of transform coefficients.

Transform processing unit 52 may send the resulting transform coefficients to quantization unit 54. Quantization unit 54 may then quantize the transform coefficients. Entropy encoding unit 56 may then perform a scan of the quantized transform coefficients in the matrix according to a scanning mode. This disclosure describes entropy encoding unit 56 as performing the scan. However, it should be understood that, in other examples, other processing units, such as quantization unit 54, could perform the scan.

Once the transform coefficients are scanned into the one-dimensional array, entropy encoding unit 56 may apply entropy coding such as CAVLC, CABAC, syntax-based context-adaptive binary arithmetic coding (SBAC), Probability Interval Partitioning Entropy (PIPE), or another entropy coding methodology to the coefficients.

To perform CABAC, entropy encoding unit 56 may select a context model to apply to a certain context to encode symbols to be transmitted. The context may relate to, for example, whether neighboring values are non-zero or not. Entropy encoding unit 56 may also entropy encode syntax elements, such as the signal representative of the selected transform.

Entropy encoding unit 56 may entropy encode prediction data. When video data is inter-predicted, for example, prediction data may include data indicating reference index values, motion vectors, motion vector predictors, motion vector difference values, and the like. That is, as noted above, motion estimation (by motion estimation unit 42) determines one or more indexes to reference pictures (ref_idx) and a prediction direction (pred_dir: forward, backward or bi-directional). Entropy encoding unit 56 may entropy encode syntax elements representing motion vectors (e.g., a horizontal component and vertical component of the motion vectors), reference picture indexes, and prediction direction. Entropy encoding unit 56 may include the encoded syntax elements into an encoded video bitstream, which may then be decoded by a video decoder (such as video decoder 30, described below) for use in a video decoding process. That is, these syntax elements may be provided for an inter-coded PU to permit video decoder 30 to decode and reproduce video data defined by a PU.

In some examples, as described in greater detail with respect to FIG. 4 below, entropy encoding unit 56 (or another coding unit of video encoder 20) may binarize syntax elements prior to entropy encoding the syntax elements. For example, entropy encoding unit 56 may convert an absolute value of each syntax element being coded into binary form. Entropy encoding unit 56 may use a unary, truncated unary, or other coding process to binarize the syntax elements. With respect to reference index values, for example, if a maximum number of reference pictures in a reference picture list is four, i.e., the reference index (ref_idx) has a value ranging from 0 to 3, then the following binarization in Table 1 may be applied:

TABLE 1

| Reference index | Binarization |
| --- | --- |
| 0 | 0 |
| 1 | 10 |
| 2 | 110 |
| 3 | 111 |

As shown in Table 1, the binarized value ranges from one bit to three bits, depending on the value of the reference index.

In some examples, entropy encoding unit 56 may entropy encode reference index values using three different contexts (e.g., ctx0, ctx1, and ctx2). For example, entropy encoding unit 56 may entropy encode a first bin (bin0) and second bin (bin1) using ctx0 and ctx1, respectively, and a third bin (bin2) and other bins are coded with context ctx2. In this example, ctx2 is shared among all of the bins starting from and including bin2, i.e., bin2 and bins after binb2, e.g., bin3, bin4, and so forth. In some examples, additional bins beyond bin2 may be provided, e.g., if the maximum number of reference pictures is greater than four.

As noted above, sharing the context ctx2 among bins may be inefficient, due to the probability updates associated with context coding. According to aspects of this disclosure, entropy encoding unit 56 may CABAC code a reference index value by dedicating ctx2 to coding bin2 and coding all bins after bin2 using a bypass coding mode. Again, bypass coding generally includes coding bins using a fixed probability (contexts are not required). For example, entropy encoding unit 56 may bypass code bins after bin2 of a reference index value using Golomb coding, exponential Golomb coding, Golomb-Rice coding, or other coding processes that bypass a CABAC coding engine.

In another example, entropy encoding unit 56 may context code fewer bins of a reference index value by removing ctx2. That is, according to aspects of this disclosure, entropy encoding unit 56 may encode bin2 and all later bins using a CABAC bypass mode. In this example, entropy encoding unit 56 may CABAC code bin0 using context ctx0 and bin1 using context ctx1, and may bypass code bin2 and other bins following bin2 using a CABAC bypass mode. Removing a context in this way may reduce the overall complexity associated with coding reference index values.

In yet another example, entropy encoding unit 56 may code fewer bins of a reference index value by removing both ctx1 and ctx2. That is, according to aspects of this disclosure, entropy encoding unit 56 may encode bin1 and all later bins using a CABAC bypass mode, thereby further reducing the complexity associated with coding reference index values. In this example, entropy encoding unit 56 may CABAC code bin0 using context ctx0, and may bypass code bin1, bin2, and other bins following bin2 using a CABAC bypass mode.

Other aspects of this disclosure generally relate to the manner in which entropy encoding unit 56 binarizes reference index values. For example, as noted above, entropy encoding unit 56 may binarize reference index values using a unary, truncated unary, or other coding process. In another example, entropy encoding unit 56 may use an exponential-Golomb coding process to binarize the reference index value.

In some examples, according to aspects of this disclosure, entropy encoding unit 56 may implement a combination of binarization processes. For example, as described in greater detail with respect to FIG. 4 below, entropy encoding unit 56 may combine a unary (or truncated unary) coding process with an exponential-Golomb coding process to binarize reference index values. In an example for purposes of illustration, entropy encoding unit 56 may combine a truncated unary code of length (4) with an exponential-Golomb code (e.g., an exponential-Golomb code of 0-order). In such an example, entropy encoding unit 56 may binarize a first number of bins (e.g., the two, three, four, or the like) of a reference index value using a unary coded, and may binarize the remaining bins of the reference index using an exponential-Golomb code.

In any case, entropy encoding unit 56 may implement the techniques for context coding one or more bins of a reference index value and bypass coding bins one or more other bins of the reference index value with any binarization scheme. For example, as noted above, entropy encoding unit 56 may context code (e.g., CABAC code) a first number of bins of a binarized syntax element and bypass code the remaining bins. In the example described above in which a truncated unary code of the length (4) is combined with an exponential Golomb code of the 0-order, entropy encoding unit 56 may context code the first two bins (or any other number of bins) of the truncated unary code and then bypass code the second portion of the unary code and the entire exponential Golomb code. In other examples, entropy encoding unit 56 may use other binarization schemes. For example, entropy encoding unit 56 may use a fixed length binary code instead of the exponential Golomb code described in the above examples.

In some examples, entropy encoding unit 56 may truncate, or remove bins from a binarized reference index value prior to coding the value. Additionally or alternatively, entropy encoding unit 56 may group bins coded using context and bins coded using a bypass mode. For example, entropy encoding unit 56 may code reference indexes of a B-picture by context coding one or more bins of a first reference index value, context code one or more bins of a second index value, bypass code one or more other bins of the first reference index value, and bypass code one or more other bins of the second reference index value (in the order presented above). Accordingly, entropy encoding unit 56 only transitions between a context coding mode and a bypass coding mode a single time, e.g., between the context coded bins and the non-context coded bins.

Following the entropy coding by entropy encoding unit 56, the resulting encoded video may be transmitted to another device, such as video decoder 30, or archived for later transmission or retrieval. Inverse quantization unit 58 and inverse transform processing unit 60 apply inverse quantization and inverse transformation, respectively, to reconstruct the residual block in the pixel domain, e.g., for later use as a reference block.

Motion compensation unit 44 may calculate a reference block by adding the residual block to a predictive block of one of the pictures of the reference picture memory 64. Motion compensation unit 44 may also apply one or more interpolation filters to the reconstructed residual block to calculate sub-integer pixel values for use in motion estimation.

Summer 62 adds the reconstructed residual block to the motion compensated prediction block produced by motion compensation unit 44 to produce a reconstructed video block for storage in reference picture memory 64. The reconstructed video block may be used by motion estimation unit 42 and motion compensation unit 44 as a reference block to inter-code a block in a subsequent picture.

Figure 3:
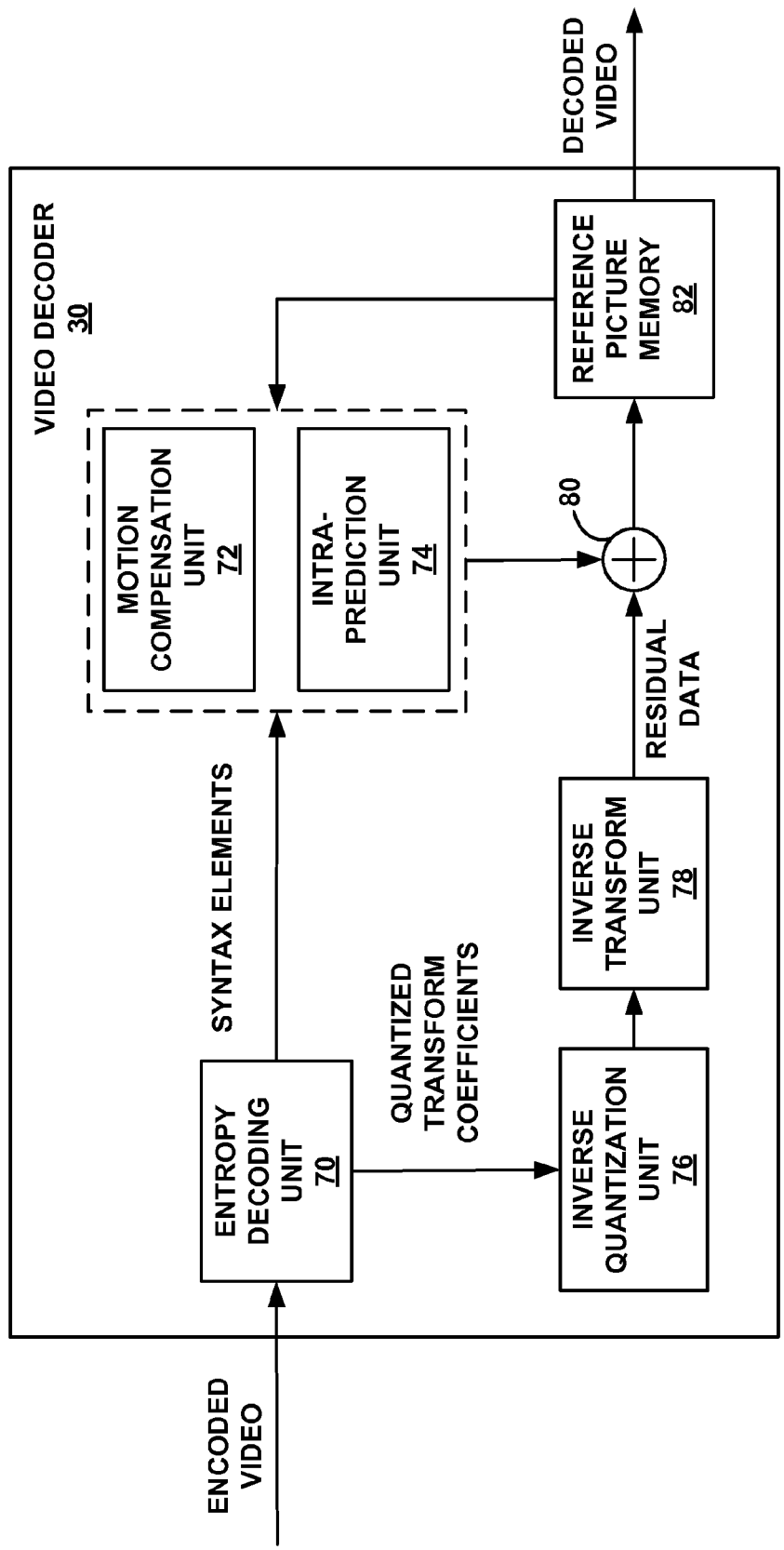
FIG. 3 is a block diagram illustrating an example video decoder.

FIG. 3 is a block diagram illustrating an example of a video decoder 30, which decodes an encoded video sequence. In the example of FIG. 3, video decoder 30 includes an entropy decoding unit 70, a motion compensation unit 72, an intra-prediction unit 74, an inverse quantization unit 76, an inverse transformation unit 78, a reference picture memory 82 and a summer 80.

By way of background, video decoder 30 may receive compressed video data that has been compressed for transmission via a network into so-called "network abstraction layer units" or NAL units. Each NAL unit may include a header that identifies a type of data stored to the NAL unit. There are two types of data that are commonly stored to NAL units. The first type of data stored to a NAL unit is video coding layer (VCL) data, which includes the compressed video data. The second type of data stored to a NAL unit is referred to as non-VCL data, which includes additional information such as parameter sets that define header data common to a large number of NAL units and supplemental enhancement information (SEI).

For example, parameter sets may contain the sequence-level header information (e.g., in sequence parameter sets (SPS)) and the infrequently changing picture-level header information (e.g., in picture parameter sets (PPS)). The infrequently changing information contained in the parameter sets does not need to be repeated for each sequence or picture, thereby improving coding efficiency. In addition, the use of parameter sets enables out-of-band transmission of header information, thereby avoiding the need of redundant transmissions for error resilience.

During the decoding process, video decoder 30 receives an encoded video bitstream that represents video blocks of an encoded video slice and associated syntax elements. In general, entropy decoding unit 70 entropy decodes the bitstream to generate quantized coefficients, motion vectors, and other syntax elements. Video decoder 30 may receive the syntax elements at the video slice level and/or the video block level.

For example, when a video slice is coded as an intra-coded (I) slice, intra prediction unit 74 may generate prediction data for a video block of the current video slice based on a signaled intra prediction mode and data from previously decoded blocks of the current picture. When the picture is coded as an inter-coded (i.e., B, P or GPB) slice, motion compensation unit 72 produces predictive blocks (also referred to as reference samples) for a video block of the current video slice based on the motion vectors and other syntax elements received from entropy decoding unit 70. The predictive blocks may be produced from one of the reference pictures within one of the reference picture lists. Video decoder 30 may construct the reference picture lists, List 0 and List 1, using default construction techniques based on reference pictures stored in reference picture memory 82.

Entropy decoding unit 70 may decode the bitstream using the same process implemented at video encoder 20 (e.g., CABAC, CAVLC, etc.). The entropy coding process used by the encoder may be signaled in the encoded bitstream or may be a predetermined process. For example, entropy decoding unit 70 may receive encoded binarized syntax elements. Entropy decoding unit 70 may decode the bitstream (e.g., using a context adaptive mode or a bypass mode) and binarize the decoded values to produce decoded syntax elements.

In some instances, entropy decoding unit 70 may entropy decode prediction data. As noted above with respect to video encoder 20, prediction data may include data indicating reference index values, motion vectors, motion vector predictors, motion vector difference values, and the like. That is, entropy decoding unit 70 may entropy decode syntax elements representing motion vectors (e.g., a horizontal component and vertical component of the motion vectors), reference picture indexes, and prediction directions. These syntax elements may be provided for an inter-coded PU to permit video decoder 30 to decode and reproduce video data defined by a PU.

In some examples, as noted above, entropy decoding unit 70 may entropy decode reference index values using three different contexts (e.g., ctx0, ctx1, and ctx2). For example, entropy decoding unit 56 may entropy decode a first bin (bin0) and second bin (bin1) using ctx0 and ctx1, respectively, and decode a third bin (bin2) and other bins with context ctx2. Sharing the context ctx2 among bins may be inefficient, due to the probability updates associated with context coding.

According to aspects of this disclosure, entropy decoding unit 70 may CABAC code a reference index value by dedicating ctx2 to coding bin2 and coding all bins after bin2 using a bypass coding mode. In another example, entropy decoding unit 70 may context code fewer bins of a reference index value by removing ctx2. That is, according to aspects of this disclosure, entropy decoding unit 70 may decode bin2 and all later bins using a CABAC bypass mode. In yet another example, entropy decoding unit 70 may code fewer bins of a reference index value by removing both ctx1 and ctx2. That is, according to aspects of this disclosure, entropy decoding unit 70 may decode bin1 and all later bins using a CABAC bypass mode, thereby further reducing the complexity associated with coding reference index values.

Other aspects of this disclosure generally relate to the manner in which entropy decoding unit 70 binarizes reference index values. In some examples, entropy decoding unit 70 may binarize reference index values using a unary, truncated unary, or other coding process. In another example, entropy encoding unit 56 may use an exponential-Golomb coding process to binarize the reference index value.

In some examples, according to aspects of this disclosure, entropy decoding unit 70 may implement a combination of binarization processes. For example, as described in greater detail with respect to FIG. 4 below, entropy decoding unit 70 may combine a unary (or truncated unary) coding process with an exponential-Golomb coding process to binarize reference index values. In an example for purposes of illustration, entropy decoding unit 70 may combine a truncated unary code of length (4) with an exponential-Golomb code (e.g., an exponential-Golomb code of 0-order). In such an example, entropy decoding unit 70 may binarize a first number of bins (e.g., the two, three, four, or the like) of a reference index value using a unary coded, and may binarize the remaining bins of the reference index using an exponential-Golomb code.

In any case, entropy decoding unit 70 may implement the techniques for context coding one or more bins of a reference index value and bypass coding bins one or more other bins of the reference index value with any binarization scheme. For example, as noted above, entropy decoding unit 70 may context code (e.g., CABAC code) a first number of bins of a binarized syntax element and bypass code the remaining bins. In the example described above in which a truncated unary code of the length (4) is combined with an exponential Golomb code of the 0-order, entropy decoding unit 70 may context code the first two bins (or any other number of bins) of the truncated unary code and then bypass code the second portion of the unary code and the entire exponential Golomb code. In other examples, entropy decoding unit 70 may use other binarization schemes. For example, entropy decoding unit 70 may use a fixed length binary code instead of the exponential Golomb code described in the above examples.

In some examples, entropy decoding unit 70 may truncate, or remove bins from a binarized reference index value prior to coding the value. Additionally or alternatively, entropy decoding unit 70 may group bins coded using context and bins coded using a bypass mode. For example, entropy decoding unit 70 may code reference indexes of a B-picture by context coding one or more bins of a first reference index value, context code one or more bins of a second index value, bypass code one or more other bins of the first reference index value, and bypass code one or more other bins of the second reference index value (in the order presented above). Accordingly, entropy decoding unit 70 only transitions between a context coding mode and a bypass coding mode a single time, e.g., between the context coded bins and the non-context coded bins.

After entropy decoding syntax elements and transform coefficients, in some examples, entropy decoding unit 70 (or inverse quantization unit 76) may scan received transform coefficient values using a scan mirroring the scanning mode used by the entropy encoding unit 56 (or quantization unit 54) of video encoder 20. Although shown as separate functional units for ease of illustration, the structure and functionality of entropy decoding unit 70, inverse quantization unit 76, and other units of video decoder 30 may be highly integrated with one another.

Inverse quantization unit 76 inverse quantizes, i.e., de-quantizes, the quantized transform coefficients provided in the bitstream and decoded by entropy decoding unit 70. The inverse quantization process may include a conventional process, e.g., similar to the processes proposed for HEVC or defined by the H.264 decoding standard. The inverse quantization process may include use of a quantization parameter QP calculated by video encoder 20 for the CU to determine a degree of quantization and, likewise, a degree of inverse quantization that should be applied. Inverse quantization unit 76 may inverse quantize the transform coefficients either before or after the coefficients are converted from a one-dimensional array to a two-dimensional array.

Intra-prediction unit 74 may generate prediction data for a current block of a current picture based on a signaled intra-prediction mode and data from previously decoded blocks of the current picture. Motion compensation unit 72 may retrieve the motion vector, motion prediction direction and reference index from the encoded bitstream. The reference prediction direction indicates whether the inter-prediction mode is uni-directional (e.g., a P-frame) or bi-directional (a B-frame). The reference index indicates the reference picture to which the motion vector is directed. Based on the retrieved motion prediction direction, reference picture index, and motion vector, the motion compensation unit produces a motion compensated block for the current portion. These motion compensated blocks are used to recreate the predictive block used to produce the residual data.

Motion compensation unit 72 may produce the motion compensated blocks, possibly performing interpolation based on interpolation filters. Identifiers for interpolation filters to be used for motion estimation with sub-pixel precision may be included in the syntax elements. Motion compensation unit 72 may use interpolation filters as used by video encoder 20 during encoding of the video block to calculate interpolated values for sub-integer pixels of a reference block. Motion compensation unit 72 may determine the interpolation filters used by video encoder 20 according to received syntax information and use the interpolation filters to produce predictive blocks.

Motion compensation unit 72 may receive prediction data indicating where to retrieve motion information for a current block. For example, motion compensation unit 72 may receive motion vector prediction information such as an MVP index (mvp_flag), an MVD, merge flag (merge_flag), and/or merge index (merge_idx) and use such information to identify motion information used to predict a current block.

For example, motion compensation unit 72 may generate a list of MVP or merge candidates. Motion compensation unit 72 may then use an MVP or merge index to identify the motion information used to predict the motion vector of a current block. That is, motion compensation unit 72 may identify an MVP from a list of reference picture using the MVP index (mvp_flag). Motion compensation unit 72 may combine the identified MVP with a received MVD to determine the motion vector for the current block. In other examples, motion compensation unit 72 may identify a merge candidate from a list of reference pictures using a merge index (merge_idx) to determine motion information for the current block. In any event, after determining motion information for the current block, motion compensation unit 72 may generate the predictive block for the current block.

Additionally, motion compensation unit 72 and intra-prediction unit 74, in an HEVC example, may use some of the syntax information (e.g., provided by a quadtree) to determine sizes of LCUs used to encode picture(s) of the encoded video sequence. Motion compensation unit 72 and intra-prediction unit 74 may also use syntax information to determine split information that describes how each CU of a picture of the encoded video sequence is split (and likewise, how sub-CUs are split). The syntax information may also include modes indicating how each split is encoded (e.g., intra- or inter-prediction, and for intra-prediction an intra-prediction encoding mode), one or more reference pictures (and/or reference lists containing identifiers for the reference pictures) for each inter-encoded PU, and other information to decode the encoded video sequence.

Summer 80 combines the residual blocks with the corresponding prediction blocks generated by motion compensation unit 72 or intra-prediction unit 74 to form decoded blocks. If desired, a deblocking filter may also be applied to filter the decoded blocks in order to remove blockiness artifacts. The decoded video blocks are then stored in reference picture memory 82, which provides reference blocks for subsequent motion compensation and also produces decoded video for presentation on a display device (such as the display device 32 of FIG. 1).

Figure 4:
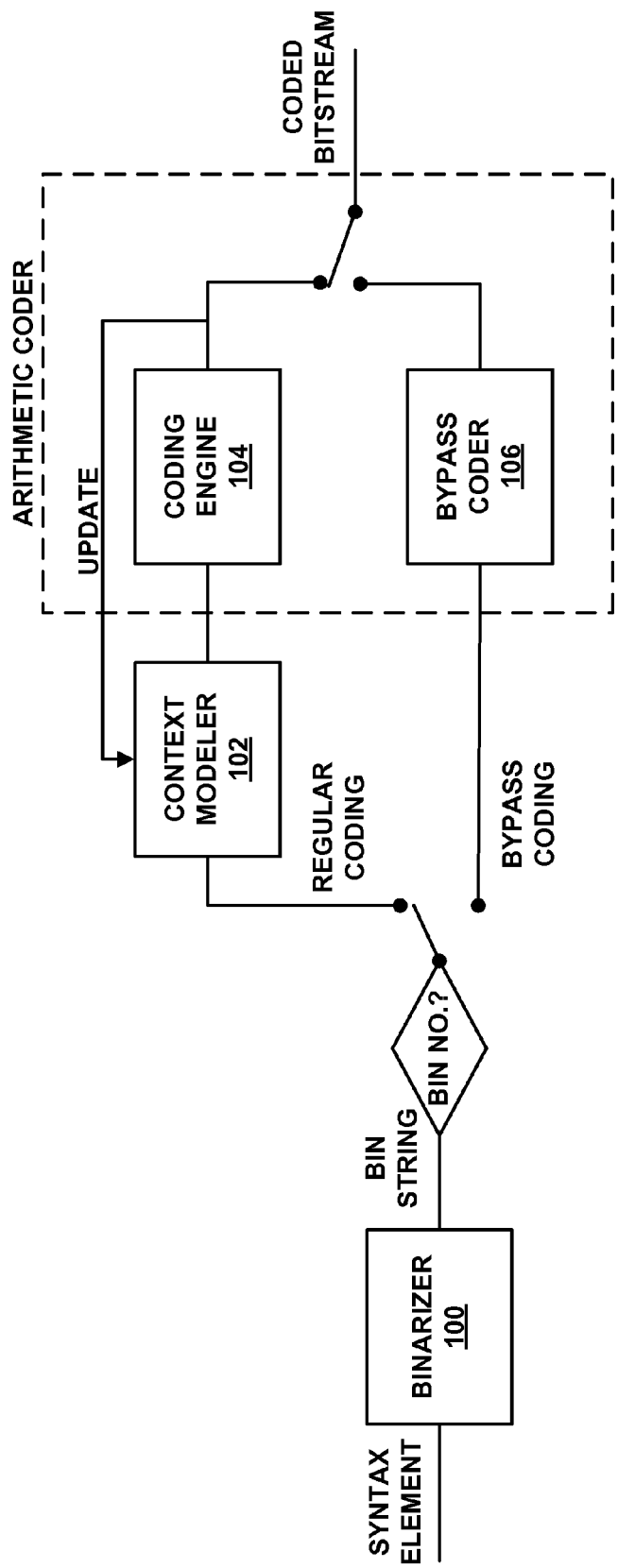
FIG. 4 is a block diagram illustrating an example arithmetic coding process.

FIG. 4 is a block diagram illustrating an example arithmetic coding process. The example arithmetic coding process of FIG. 4 is generally described as being performed by video encoder 20. However, it should be understood that the techniques described with respect to FIG. 4 may be performed by a variety of other video coders, including video decoder 30. For example, as noted above with respect to FIG. 3, video decoder 30 may perform a decoding process that is reciprocal to the process performed by video encoder 20.

The example of FIG. 4 includes a binarizer 100, a context modeler 102, a coding engine 104, and a bypass coder 106. Binarizer 100 is responsible for binarizing a received syntax element. For example, binarizer 100 may map a syntax element to a number of so-called bins, with each bin representing a binary value. In an example for purposes of illustration, binarizer 100 may map a syntax element to bins using truncated unary (TU) code. In general, unary coding may involve generating a bin string of length N+1, where the first N bins are 1 and the last bins is 0. Truncated unary coding may have one less bin than unary coding by setting a maximum on the largest possible value of the syntax element (cMax). An example of truncated unary coding is shown in Table 2 with cMax=10.

TABLE 2

| Value | Bin string |
|-------|------------|
| 0 | 0 |
| 1 | 10 |
| 2 | 110 |
| 3 | 1110 |
| 4 | 11110 |
| 5 | 111110 |
| 6 | 1111110 |
| 7 | 11111110 |
| 8 | 111111110 |
| 9 | 1111111110 |
| 10 | 1111111111 |

When performed at video decoder 30, video decoder 30 may search for a 0 to determine when the syntax element currently being coded is complete. As described in greater detail below, truncated unary coding is merely an example, and binarizer 100 may perform a variety of other binarization processes (as well as combinations of binarization processes) to binarize syntax elements.

Context modeler 102 may be responsible for determining a context model (also referred to as a probability model) for a given bin. For example, context modeler 102 may select a probability model that operates on context to code symbols associated with a block of video data. In general, the probability model stores the probability of each bin being "1" or "0."

Context modeler 102 may select the probability model from a number of available probability models. In some examples, as described in greater detail below, a context used by context modeler 102 may be determined based on the bin number being coded. That is, the context may depend on the position of the bin in the bin string generated by binarizer 100. In any event, at video encoder 20, a target symbol may be coded by using the selected probability model. At video decoder 30, a target symbol may be parsed by using the selected probability model.

Coding engine 104 codes the bin using the determined probability model (from context modeler 102). After coding engine 104 codes the bin, coding engine 104 may update the probability model associated with the context used to code the bin. That is, the selected probability model is updated based on the actual coded value (e.g. if the bin value was "1", the frequency count of a "1" is increased). Coding bins using context modeler 102 and coding engine 104 may be referred to as coding the bins using a context coding mode.

Bypass coder 106 codes bins using a fixed probability. In contrast to the context coding (via context modeler 102 and coding engine 104), bypass coder 106 does not update the bypass coding process based on the actual values of the bins being coded. Accordingly, in general, bypass coder 106 may bypass code bins more quickly than context coding. Coding bins using bypass coder 106 may be referred to as coding the bins using a bypass coding mode. Example bypass coding modes include Golomb coding, exponential Golomb coding, Golomb-Rice coding, or any other suitable coding process that bypasses context modeler 102 and coding engine 104.

Coded bins (from coding engine 104 and bypass coder 106) are combined to form a coded bitstream. To decode the encoded bitstream, a video decoder (such as video decoder 30) may mirror the process shown in FIG. 4. That is, video decoder 30 may preform context coding (using context modeler 102 and coding engine 104) or bypass coding (using bypass coder 106) on an encoded bitstream to generate a decoded bin string. Video decoder 30 may then binarize the bin string (using binarizer 100) to generate syntax values.

The arithmetic coding process show in FIG. 3 may be used to code video data. For example, the coding process shown in FIG. 3 may be used to code prediction data, including reference index values, motion vectors, motion vector predictors, motion vector difference values, and the like.

In an example for purposes of illustration, binarizer 100 may binarize a reference index (ref_idx). In some examples, the resulting bin string for the reference index may be up to 15 bins in length, depending on the number of reference pictures that are available for reference. As noted above, in some examples, all of the bins of a reference index value may be context coded using context modeler 102 and coding engine 104. Moreover, one or more of the bins may share a context. However, context coding all of the bins and sharing a context among more than one bin may be inefficient, due to the latencies associated with context coding.

According to aspects of this disclosure, as shown in FIG. 4, video encoder 20 may encode a bin string for a reference index based on the bin number of the bin being coded. For example, video encoder 20 may code a particular bin in a reference index bin string according to a relative position of the particular bin in the bin string. In an example, video encoder 20 may context code a first, a second bin, and a third bin of a reference index, and may bypass code the remaining bins of the reference index. That is, video encoder 20 may code a first bin (bin0) using context modeler 102 and coding engine 104 with a first context ctx0, a second bin (bin1) using context modeler 102 and coding engine 104 with a second context ctx1, and a third bin (bin2) using context modeler 102 and coding engine 104 with a third context ctx2. However, video encoder 20 may code the fourth bin (bin3) and any other following bins using bypass coder 106.

In another example, video encoder 20 may reduce the number of bins that are context coded. For example, video encoder 20 may code a first bin (bin0) using context modeler 102 and coding engine 104 with a first context ctx0, and a second bin (bin1) using context modeler 102 and coding engine 104 with a second context ctx1. In this example, however, video encoder 20 may bypass code a third bin (bin2) and any other following bins using bypass coder 106.

In still another example, video encoder 20 may further reduce the number of bins that are context coded. For example, video encoder 20 may code a first bin (bin0) using context modeler 102 and coding engine 104 with a first context ctx0. However, video encoder 20 may code the second bin (bin1) and any other following bins using bypass coder 106.

Aspects of this disclosure also relate to the manner in which binarizer 100 performs binarization for video data. For example, according to aspects of this disclosure, binarizer 100 may divide a syntax element into more than one part. That is, binarizer 100 may use truncated unary coding to code a prefix (with a relatively small cMax, as described above) and may use another coding method to code the suffix. In an example, binarizer 100 may use a kth order exponential-Golomb code to code the suffix.

In some examples, only the bins of the prefix may be context coded, while the bins of the suffix may be bypass coded. Table 3 shows an example of truncated unary combined code with an exponential-Golomb code, with cMax=4 for prefix and $0^{th}$ order Exp-Golomb for suffix. These techniques may also be applied to reference index values as well as other syntax elements, such as motion vector difference values or other syntax elements used in coding via advanced motion vector prediction (AMVP).

TABLE 3

| Value | Bin string (truncated unary) | Bin string ($0^{th}$ order Exp-Golomb) |
|---|---|---|
| 0 | 0 | |
| 1 | 10 | |
| 2 | 110 | |
| 3 | 1110 | |
| 4 | 1111 | 0 |
| 5 | 1111 | 100 |
| 6 | 1111 | 101 |
| 7 | 1111 | 11000 |
| 8 | 1111 | 11001 |
| 9 | 1111 | 11010 |
| 10 | 1111 | 11011 |

In the example shown in Table 3, the truncated unary bins may be context coded, while the exponential-Golomb bins may be bypass coded.

The techniques of this disclosure may include, for example, applying context coding to bins after a certain number of bins for the exponential-Golomb binarization in a prefix part. The techniques of this disclosure also include, for example, applying context based coding to a certain number of bins (e.g., a predetermined number of prefix bins) and applying bypass coding to the remaining bins. For example, instead of coding all the bins in a prefix part using context, bin2 and later bins in the prefix part may be coded with bypass mode. In another example, bypass mode may be applied to all bins after and/or including bin1. In still another example, bypass mode may be applied to all bins of the prefix part. A similar approach using bypass mode coding after a certain number of context coded bins can be used for any binarization method. That is, while this disclosure describes using exponential-Golomb and truncated unary coding schemes, other binarization methods may be used.

In yet another example, the techniques of this disclosure described above may be implemented in conjunction with other binarization processes, including combinations of binarization processes. That is, in one example, a unary coding process may be used to binarize the reference index value. In another example, a truncated unary coding process may be used to binarize the reference index value. In still another example, an exponential-Golomb coding process may be used to binarize the reference index value. Other binarization processes and combinations of binarization processes are also possible. That is, for example, a unary (or truncated unary) coding process may be combined with an exponential-Golomb coding process to binarize the reference index value. In an example for purposes of illustration, a truncated unary code of length (4) can be combined with an exponential-Golomb code (e.g., an exponential-Golomb code of 0-order). In such an example, a first number of bins (e.g., the two, three, four, or the like) of the reference index value may be unary coded, while the remaining bins of the reference index may be exponential-Golomb coded.

In any case, the techniques described above with respect to CABAC and bypass coding the reference index value may be applied to any binarized reference index value. That is, according to aspects of this disclosure, a first number of bins of a binarized reference index value may be context coded (e.g., coded with a CABAC engine), while the remaining bins may be bypass coded. In the example described above, in which a truncated unary code of the length (4) is combined with an exponential Golomb code of the 0-order, the first two bins (or any other number of bins) of the truncated unary code may be context coded, and the second part of the unary code and the entire exponential Golomb code may be bypass coded.

It should be understood that the truncated unary code of length (4) and exponential Golomb of 0-order are provided for purposes of example only, and the same or similar techniques may be applied for other truncated unary code lengths, as well as for other orders of exponential Golomb code. Moreover, the binarization processes described above are provided for purposes of example only, and other binarized codes may be used. For example, a fixed length binary code may be used instead of the exponential Golomb code described in the above examples. In addition, the example of two context coded bins for the truncated unary binarization portion is provided for purposes of illustration and other numbers of context and bypass coded bins may be used.

In any case, aspects of this disclosure also relate to truncating a portion of the binarized value. For example, because the number of reference indexes is known in advance, according to aspects of this disclosure, the exponential Golomb or fixed length code can be truncated. That is, an exponential Golomb of order k may be used by binarizer 100. As an example, an exponential Golomb of 0-order may be applied in video compression. This binarization consists of an exponential prefix coded with unary code and fixed length suffix of the length (prefix-1), an example of which is shown in Table 4 below:

TABLE 4

| Element | Exponential Golomb 0-order | Unary code | Binary number |
|---|---|---|---|
| 0 | 1 | 1 | 000 |
| 1 | 01 0 | 01 | 001 |
| 2 | 01 1 | 001 | 010 |
| 3 | 001 00 | 0001 | 011 |
| 4 | 001 01 | 00001 | 100 |
| 5 | 001 10 | 000001 | 101 |
| 6 | 001 11 | 0000001 | 110 |
| 7 | 0001 000 | 00000001 | 111 |
| 8 | 0001 001 | 000000001 | ... |
| 9 | 0001 010 | ... | |
| 10 | 0001 011 | | |
| 11 | 0001 100 | | |
| 12 | 0001 101 | | |
| 13 | 0001 110 | | |
| 14 | 0001 111 | | |
| 15 | 00001 0000 | | |
| ... | ... | | |

For example, value 10 (e.g., which corresponds to element with value 10 in the first column of Table 4) is represented by the binarized codeword 0001011, where 0001 is a prefix and 011 is a suffix. The element may be input data, which is coded using the codewords of Table 4 or using the tables shown and described below. For example, video encoder 20 may receive the elements and convert the elements into codewords according to the tables shown and described below. Likewise, video decoder 30 may receive the codewords and convert the codewords into syntax elements (e.g., input data) according to the tables shown and describe below.

A reconstructed value may be obtained according to equation (1), shown below:

$$value=2^{(prefix-1)}+suffix-1 \quad (1)$$

In this example, the prefix is represented by a unary code where 0001 corresponds to 4, and the suffix is a value represented with a binary numeral system where 011 corresponds to 3, as shown in Table 4 above. Accordingly, in this example, applying equation (1) results in the following values: $2^{(4-1)}+3-1=10$.

This code can represent generally infinite numbers; however, in some scenarios, the number of elements can be known. In this case, the codeword can be shortened, taking into account the maximum number of possible elements.

For example, if the maximum number of elements is two (e.g., elements 0 and 1), a regular Exponential Golomb codeword for 1 is 010. However, there is no element greater than two. Accordingly, the regular code 010 can be shortened to 1. This type of binarization may be referred to as Truncated Exponential Golomb, and may be used in video coding standards such as H.264/AVC. However, with respect to the H.264 standard, the Truncated Exponential Golomb is only used when the maximum number of elements is 1. For other cases, regular Exponential Golomb binarization is used.

According to aspects of this disclosure, regular Exponential Golomb coding may be further truncated, for example, in a manner similar to the example above in which the maximum number of elements is 1. Generally, when maximum number of elements is known in advance, the suffix of the Exponential Golomb binarization codeword can be truncated by removing redundant bins. For example, if the maximum number of elements is 9, then the two bins marked with bold, italics, and underline in Table 5 shown below can be removed from the codewords.

TABLE 5

| Element | Exponential Golomb 0-order | Truncated Exponential Golomb of order 0 |
|---|---|---|
| 0 | 1 | 1 |
| 1 | 01 0 | 01 0 |
| 2 | 01 1 | 01 1 |
| 3 | 001 00 | 001 00 |
| 4 | 001 01 | 001 01 |
| 5 | 001 10 | 001 10 |
| 6 | 001 11 | 001 11 |
| 7 | 0001 *__00__*0 | 0001 0 |
| 8 | 0001 *__00__*1 | 01 |

That is, for element 7 shown in Table 5, the first two 00s of the suffix may be removed. In addition, for element 8 shown in Table 5, the first two 00s of the suffix may be removed. Accordingly, the Truncated Exponential Golomb of order 0 indicates the 0001 0 for element 7 and 00001 1 for element 8.

The techniques described above may be implemented, for example, by comparing a fixed length suffix for the latest prefix (0001 in the above example) to the regular Exponential Golomb code. For example, if number of elements in the latest group is smaller than in a regular Exponential Golomb code, the redundant bins can be removed. In other words, binarizer 100 may generate the resulting truncated exponential Golomb code of order 0 by comparing the fixed length suffix for the latest prefix, and if the number of elements in this latest group is smaller than in regular Exponential Golomb code, the redundant bins can be removed.

For instance, in this example, binarizer 100 may determine the number of elements whose prefix is the same as the prefix of the last element when there is a maximum number of elements for coding that is known in advance. For example, in Table 5, the prefix for the last element is 0001, and there are two elements (e.g., element 7 and element 8) whose prefix is the same as the prefix of the last element when there are a maximum number of elements (e.g., 9 in this example).

Binarizer may then compare the number of elements whose prefix is the same as the prefix of the last element with the number of elements in the regular Exponential Golomb code with the same prefix. For example, in Table 4 above, there are eight elements (i.e., element 7 to element 14) whose prefix is 0001 (i.e., the same as the prefix of the previous element). In this example, binarizer 100 may determine that the number of elements whose prefix is the same as the prefix of the last element is less than the number of elements in the regular Exponential Golomb code with the same prefix.

When this is true, binarizer 100 may truncate bins from codewords whose prefix is the same as the last prefix to generate truncated codewords. In some examples, the bins are truncated from the suffix; although, aspects of this disclosure are not so limited. Binarizer 100 may determine the number of bins to truncate based on the number of elements whose prefix is the same as the last prefix.

For instance, in Table 5 above, there are two elements with the same prefix as the last prefix (e.g., elements 7 and 8). Binarizer 100 may truncate bins from codewords of elements 7 and 8 to generate truncated codewords, as illustrated in the last column of Table 5. In this example, because there are two elements with same prefix as the last prefix, binarizer 100 may determine that only one bin is needed in the suffix to represent the two elements. For example, a 0 in the suffix may represent one element (e.g., element 7), and a 1 in the suffix may represent another element (e.g., element 8). Accordingly, for element 7 in Table 5 above, binarizer 100 may truncate the first two bins of the suffix, leaving only 0 as the suffix for the truncated codeword. Also, for element 8 in Table 5 above, binarizer 100 may truncate the first two bins of the suffix, leaving only 1 as the suffix for the truncated codeword.

The techniques described above may be implemented for coding media (such as encoding and/or decoding video data). For example, according to aspects of this disclosure, a video decoder, such as video decoder 30, may receive one or more codewords representative of media data, and there may be a maximum number of elements that can be used for coding. Video decoder 30 may convert the codewords to elements according to a coding table. The coding table may be constructed such that at least some of the codewords having the same prefix are truncated when the same prefix is the last prefix in the coding table, and the number of codewords having the same prefix is less than a maximum number of unique codewords that could have the same prefix. For example, for prefix 0001, Table 4 illustrates unique possibilities for codewords, and Tables 5 and 6 (shown below) show examples of codewords that share the same prefix and are truncated according to the techniques of this disclosure.

The techniques may also be performed by video encoder 20. For example, video encoder 20 may receive one or more elements representative of media data. Video encoder 20 may convert the elements into one or more codewords according to a coding table, and there may be a maximum number of elements that can be used for coding. The coding table may be constructed such that at least some of the codewords having the same prefix are truncated when the same prefix is the last prefix in the coding table, and the number of codewords having the same prefix is less than a maximum number of unique codewords that could have the same prefix. Again, for example, for prefix 0001, Table 4 illustrates unique possibilities for codewords, and Tables 5 and 6 (shown below) show examples of codewords that share the same prefix and are truncated according to the techniques of this disclosure.

In this manner, the techniques may reduce the number of bins needed for coding video data when a maximum number of elements being coded are known. The reduction in bins results in fewer bits that need to be signaled or received, resulting in bandwidth efficiency.

In yet another example, if maximum number of elements is 11, the Truncated Exponential Golomb codewords are shown in Table 6 below. The bins marked with bold, italics, and underline in Table 6 can be removed from the codewords.

As shown in Table 6, the first bins in the suffix for elements 7, 8, 9, and 10 may be truncated (shown in bold, italics, and underline). In this example, only one bin from the suffix may be truncated, because four elements are represented by the codeword. For this reason, in the truncated codewords, the suffix starts from 00 and ends at 11 to cover four elements, each with the same prefix.

The examples shown in Tables 5 and 6 above provide as examples only, and the same process can be applied for any number of maximum elements. For instance, in some examples, aspects of this disclosure relate to receiving truncated codewords. The truncated codewords may be generated by determining a first number of elements. The first number of elements may indicate how many codewords in a first coding table have a prefix that is the same as a prefix of a codeword that corresponds to a last element in the first coding table when there are a maximum number of elements that can be used for coding. In this example, the first coding table may be Table 5 or Table 6. Aspects relate to receiving the truncated codewords that are presorted or calculated on the fly during operation.

Aspects of this disclosure also relate to determining a second number of elements that indicate how many codewords in a second coding table have a prefix that is the same as the prefix of the codewords that corresponds to the last element in the first coding table. In this example, the second coding table may be Table 4 above. In some examples, the first coding table may be a subset of the second coding table, which is based on the maximum number of elements that can be used for coding.

In some examples, when the first number of elements is less than the second number of elements, aspects of this disclosure relate to truncating bins from codewords in the first coding table whose prefix is the same as the prefix of the codeword that corresponds to the last element in the first coding table to generate truncated codewords, and coding the video data using the truncated codewords. In some examples, truncating the codewords includes truncating bins from suffixes or prefixes of the codewords, or a combination thereof. In some examples, truncating bins is based on the first number of elements, where the first number of elements indicates how many codewords in a first coding table have a prefix that is the same as a prefix of a codeword that corresponds to a last element in the first coding table. In some examples, the coding is Golomb coding.

Alternatively or additionally, a prefix may also be shortened using a truncated unary code. For example, if maximum number of elements is 4, then a prefix and a suffix can be truncated as shown in Table 7 below.

TABLE 6

| Element | Exponential Golomb 0-order | Truncated Exponential Golomb of order 0 |
| --- | --- | --- |
| 0 | 1 | 1 |
| 1 | 01 0 | 01 0 |
| 2 | 01 1 | 01 1 |
| 3 | 001 00 | 001 00 |
| 4 | 001 01 | 001 01 |
| 5 | 001 10 | 001 10 |
| 6 | 001 11 | 001 11 |
| 7 | 0001 *0* 00 | 0001 00 |
| 8 | 0001 *0* 01 | 0001 01 |
| 9 | 0001 *0* 10 | 0001 10 |
| 10 | 0001 *0* 11 | 0001 11 |

TABLE 7

| Element | Exponential Golomb 0-order | Truncated Exponential Golomb of order 0 |
| --- | --- | --- |
| 0 | 1 | 1 |
| 1 | 01 0 | 01 0 |
| 2 | 01 1 | 01 1 |
| 3 | 00 *1 00* | 00 |

The truncated bins of Table 7 are represented in bold, italics, and underline. In the example shown in Table 7, the codeword for the element 3 is shorter than the codewords for elements 1 or 2. Additional reordering or mapping for Truncated Exponential Golomb binarization may be applied, for example, by assigning shorter codeword 00 to more frequently occurring element 1 and 010 to element 3. Such reordering or mapping may be performed using mapping tables.

In some examples, reordering may also be based on the appearance frequency of particular elements. For example, shorter codewords may be assigned to the most frequently appearing elements. This codeword mapping may be particularly efficient in cases when the elements are ordered by the frequency of appearance.

While certain examples above were described with respect to Exponential Golomb of 0-order coding, it should be understood that the techniques are more generally applicable to Exponential Golomb of k-order coding. Moreover, the techniques are not limited to HEVC video standard, and may be applied to any video compression standard, or, more broadly, for any application in which binarization is performed.

With respect to the emerging HEVC standard (as well as extensions to the HEVC standard, such as scalable video coding (SVC) or multi-view video coding (MVC)), the Truncated Exponential Golomb binarization techniques described above may be applied to binarize a variety of syntax elements. Examples include reference index values, an intra-mode mode, a merge index, quantization parameters (or delta quantization parameters), or any other syntax element for which a number of elements is known in advance.

While the above example describes Exponential Golomb truncation, the truncation techniques described may also be applied to a fixed length code. That is, in examples in which a syntax element (e.g., a reference index) is binarized using more than one binarization process (e.g., truncated unary and Exponential Golomb), a predetermined number of bins may be CABAC coded, while the remaining bins may be truncated and bypass coded.

In some examples, an algorithm may be applied to determine the number of bins that may be truncated (e.g., truncated from the Exponential Golomb or fixed length binarization portion of the binarized syntax element). In an example, assume that a predetermined number of bins remain to be bypass coded. In this example, a video coder (such as video encoder 20 or video decoder 30) may determine the number of remaining bins that may be truncated by calculating a rounded up log 2 of the remaining bins.

FIGS. 5A and 5B are block diagrams illustrating example bin strings associated with prediction data. For example, FIG. 5A generally illustrates a reference index (ref_idx), a motion vector difference (mvd), and a motion vector predictor index (mvp_idx) for a picture that is predicted from a single reference picture.

FIG. 5B generally illustrates a first reference index (ref_idx_L0), a first motion vector difference (mvd_L0) (representing the horizontal component and vertical component), and a first motion vector predictor index (mvp_idx_L0), as well as a second reference index (ref_idx_L1), a second motion vector difference (mvd_L1) (representing the horizontal component and vertical component), and a second motion vector predictor index (mvp_idx_L1) for a picture that is predicted from two reference pictures (a B-picture). That is, for a bi-predicted PU, two reference indexes may be coded, with one reference index for each list of list L0 and list L1. Accordingly, up to two reference indexes may be coded per PU, and up to eight indexes may be coded per CU.

Bin strings 120 (FIG. 5A) and 124 (FIG. 5B) include prediction data associated with an advanced motion vector prediction (AMVP) technique. With AMVP, a motion vector for a block currently being coded may be coded as a difference value (i.e., delta) relative to another motion vector, such as a motion vector associated with a spatial or temporally neighboring block. For example, video encoder 20 may build a motion vector predictor candidate list that includes motion vectors associated with one or more neighboring blocks in spatial and temporal directions. Video encoder 20 may select the most accurate motion vector predictor (MVP) from the candidate list based on, for example, a rate-distortion cost analysis.

Video encoder 20 may indicate the reference picture for the actual motion vector using the reference index (ref_idx). In addition, video encoder 20 may indicate the selected MVP using the motion vector predictor index (mvp_idx), which identifies the MVP in the candidate list. Video encoder 20 may also indicate the difference between motion vector of the current block (the actual motion vector) and the MVP using the motion vector difference (mvd). As noted above, the mvd may include a horizontal component and a vertical component corresponding to the horizontal component and the vertical component of the mvp.

Video decoder 30 may build a MVP candidate list in the same way. Video decoder 30 may then use the received motion vector predictor index (mvp_idx) to determine where to locate the MVP in the candidate list. Video decoder 30 may combine the motion vector difference (mvd) with the motion vector predictor (determined using the motion vector predictor index (mvp_idx)) so as to reconstruct the motion vector.

Predicting the motion vectors in this way (e.g., with a difference value) may require fewer bits to be included in the bitstream relative to coding actual motion vector(s). With respect to FIG. 5B, bi-predicted pictures may include prediction data associated with pictures from two different lists, e.g., list 0 and list 1. As shown in the example of FIG. 5B, the prediction data associated with list 0 may precede the prediction data that is associated with list 1. That is, bin string 124 includes a first reference index (ref_idx_L0), a first motion vector difference (mvd_L0) (e.g., representing both the horizontal and vertical components), and a first motion vector predictor index (mvp_idx_L0), followed by a second reference index (ref_idx_L1), a second motion vector difference (mvd_L1) (e.g., representing both the horizontal and vertical components), and a second motion vector predictor index (mvp_idx_L1).

In some examples, syntax related to AMVP may be coded using a combination of context coding and bypass coding. For example, as shown in the examples of FIGS. 5A and 5B, some of the bins of prediction data are context coded, while other bins are bypass coded. That is, one or more bins of motion vector difference values (as well as other values, such as reference index values as described with respect to FIG. 7 below) may be context coded, while one or more other bins of motion vector difference values may be bypass coded.

With respect to the example of FIG. 5A, the reference index (ref_idx) and a first portion of the motion vector difference (mvd) may be context coded, as indicated by context coded bins 128. A second portion of the motion vector difference (mvd) may be bypass coded, as indicated by bypass coded bins 130. In addition, the motion vector predictor index (mpv_idx) may be context coded, as indicated by context coded bins 132.

With respect to the example of FIG. 5B, the first reference index (ref_idx_L0) and a first portion of the first motion vector difference (mvd_L0) (e.g., representing both the horizontal and vertical components) may be context coded, as indicated by context coded bins 136. A second portion of the first motion vector difference (mvd_L0) (e.g., representing both the horizontal and vertical components) may be bypass coded, as indicated by bypass coded bins 138. In addition, the first motion vector predictor index (mpv_idx_L0), the second reference index (ref_idx_L1), and a first portion of the second motion vector difference (mvd_L1) (e.g., representing both the horizontal and vertical components) may be context coded, as indicated by context coded bins 140. A second portion of the second motion vector difference (mvd_L1) (e.g., representing both the horizontal and vertical components) may also be bypass coded, as indicated by bypass coded bins 142. Finally, the second motion vector predictor index (mpv_idx_L1) may be context coded, as indicated by context coded bins 144.

Accordingly, the example of FIG. 5B illustrates PU-based inter mode syntax for bi-prediction for which a video coder may have to switch four times between context coding and bypass coding to process the bins. Switching between context coding and bypass coding to code bins strings 120 and 124 may be inefficient. For example, switching between context coding and bypass coding may consume one or more clock cycles. Accordingly, switching between context coding and bypass coding for each element may introduce latency, due to the transitions between context coding and bypass coding.

According to aspects of this disclosure, as described in greater detail with respect to FIGS. 6 and 7 below, context bins and bypass bins may be grouped to reduce transitions between context coding and bypass coding. For example, with respect to FIG. 5A, aspects of this disclosure relate to grouping context coded bins 128 and 132 together, such that the bins are not separated by bypass coded bins 130. In this way, a single transition may be made between context coding and bypass coding during the coding of bin string 120.

Likewise, with respect to FIG. 5B, aspects of this disclosure relate to grouping context coded bins 136, 140, and 144, such that the bins are not separated by bypass coded bins 138 and 142. Again, grouping the context coded bins and bypass coded bins in this way may allow a video coder (such as video encoder 20 or video decoder 30) to make a single transition between context coding and bypass coding. Avoiding multiple transitions between context coding and bypass coding may increase efficiency by limiting the latency associated with the transitions.

FIG. 6 is a block diagram illustrating another example bin string 140 of prediction data. Bin string 140 includes a first reference index (ref_idx_L0), a first motion vector difference (mvd_L0) (e.g., representing both the horizontal and vertical components), and a first motion vector predictor index (mvp_idx_L0), followed by a second reference index (ref_idx_L1), a second motion vector difference (mvd_L1) (e.g., representing both the horizontal and vertical components), and a second motion vector predictor index (mvp_idx_L1). Bin string 140 includes context coded bins 144 and bypass coded bins 148. For example, context coded bins 144 may be coded using a context coding mode of a context adaptive coding process (e.g., CABAC), while bypass coded bins 148 may be coded using a fixed probability (e.g., a CABAC bypass coding mode).

According to aspects of this disclosure, the context coded bins 144 are grouped for coding prior to bypass bins 148. That is, in the example shown in FIG. 6, context coded bins 144 include context coded bins of a first reference index (ref_idx_L0), context coded bins of a second reference index (ref_idx_L1), context coded bins of a first motion vector predictor index (mvp_idx_L0), context coded bins of a second motion vector predictor index (mvp_idx_L1), context coded bins of a first motion vector difference (mvd_L0), and context coded bins of a second motion vector difference (mvd_L1). In addition, bypass coded bins 148 include bypass coded bins of the first motion vector difference (mvd_L0) and bypass coded bins of the second motion vector difference (mvd_L1).

In some examples, bins may be grouped based on the bin numbers of the syntax elements being coded. In an example for purposes of illustration, a video coder (such as video encoder 20 or video decoder 30) may code the first two bins of the motion vector difference values using context coding and code the remaining bins using bypass coding. Accordingly, in this example, context coded bins 144 may include the first two bins of both the first motion vector difference (mvd_L0) and the second motion vector difference value (mvd_L1), while bypass coded bins 148 may include the remaining bins of the motion vector difference values.

The ordering of syntax elements shown in FIG. 6 is provided for purposes of example only. In other examples, syntax elements may be ordered differently, e.g., with reference index values, motion vector predictors, and motion vector difference values in an alternative order (or interleaved). That is, in another example, a video coder may code a PU as follows: context coded bins of reference index L0, context coded bins of reference index L1, bypass mode coded bins of reference index L0, bypass mode coded bins of reference index L1. In still other examples, bypass bins 148 may be coded prior to context coded bins 144.

In any case, FIG. 6 shows prediction data having a group of one or more context coded bins 144 and a group of one or more bypass coding bins 148. Grouping the context coded bins and bypass coded bins in this way may, as noted above, reduce latency associated with coding the bins. For example, a video coder may code all of the context coded bins 144, make a single transition from context coding to bypass coding, and code all of the bypass coded bins. Avoiding multiple transitions between context coding and bypass coding may increase efficiency by limiting the latency associated with transitioning between context coding and bypass coding.

In some examples, as shown in FIG. 6, context coded bins and bypass coded bins may be grouped for a block of video data (e.g., on a per-PU basis). In other examples, context coded bins and bypass coded bins may be grouped for CUs (e.g., one or more CUs of an LCU), for an entire LCU, or for an entire slice of video data. In such examples, context coded bins may be grouped and coded for a CU/LCU/slice prior to bypass coded bins of the CU/LCU/slice, or vice versa.

FIG. 7 is a block diagram illustrating another example bin string 160 of prediction data. In the example of FIG. 7, bin string 160 includes a first reference index (ref_idx_L0), a first motion vector difference (mvd_L0) (e.g., representing both the horizontal and vertical components), and a first motion vector predictor index (mvp_idx_L0), followed by a second reference index (ref_idx_L1), a second motion vector difference (mvd_L1) (e.g., representing both the horizontal and vertical components), and a second motion vector predictor index (mvp_idx_L1). Bin string 160 includes context coded bins 164 and bypass coded bins 168. For example, context coded bins 164 may be coded using a context coding mode of a context adaptive coding process (e.g., CABAC), while bypass coded bins 168 may be coded using a fixed probability (e.g., a CABAC bypass coding mode).

According to aspects of this disclosure, similar to the example shown in FIG. 6, context coded bins 164 are grouped for coding prior to bypass bins 168. However, in the example shown in FIG. 7, the reference indexes (ref_idx_L0 and ref_idx_L1) include a combination of context coded bins as well as bypass coded bins. That is, the reference indexes may be coded according to the examples described with respect to FIG. 4 above, with one or more bins being coded using a context adaptive mode and one or more other bins being coded using a bypass mode.

Accordingly, in the example of FIG. 7, context coded bins 164 include context coded bins of a first reference index (ref_idx_L0), context coded bins of a second reference index (ref_idx_L1), context coded bins of a first motion vector predictor index (mvp_idx_L0), context coded bins of a second motion vector predictor index (mvp_idx_L1), context coded bins of a first motion vector difference (mvd_L0) (e.g., representing both the horizontal and vertical components), and context coded bins of a second motion vector difference (mvd_L1) (e.g., representing both the horizontal and vertical components). In addition, bypass coded bins 168 include bypass coded bins of the first reference index (ref_idx_L0), bypass coded bins of the second reference index (ref_idx_L1), bypass coded bins of the first motion vector difference (mvd_L0) and bypass coded bins of the second motion vector difference (mvd_L1).

As described above with respect to FIG. 6, bins may be grouped based on the bin numbers of the syntax elements being coded. In an example for purposes of illustration, a video coder (such as video encoder 20 or video decoder 30) may code the first two bins of the motion vector difference values using context coding and code the remaining bins using bypass coding. In addition, the video coder may code the first two bins of the reference indexes using context coding and code the remaining bins using bypass coding. Accordingly, in this example, context coded bins 144 may include the first two bins of both the first motion vector difference (mvd_L0) and the second motion vector difference value (mvd_L1), and the first two bins of both the first reference index (ref_idx_L0) and second reference index (ref_idx_L1). Bypass coded bins 148 may include the remaining bins of the motion vector difference values and reference indexes.

Grouping the context coded bins and bypass coded bins may reduce latency associated with coding the bins. For example, a video coder may code all of the context coded bins 144, make a single transition from context coding to bypass coding, and code all of the bypass coded bins. Avoiding multiple transitions between context coding and bypass coding may increase efficiency by limiting the latency associated with transitioning between context coding and bypass coding.

It should be understood that the techniques described with respect to FIGS. 6 and 7 may be performed using any binarization scheme. Moreover, as noted above, the ordering of syntax elements is provided for purposes of example only. In addition, context coded bins and bypass coded bins may be grouped for a PU, for one or more CUs, for an entire LCU, or for an entire slice of video data. In such examples, context coded bins may be grouped and coded for a PU/CU/LCU/slice prior to bypass coded bins of the PU/CU/LCU/slice, or vice versa.

Figure 8A:
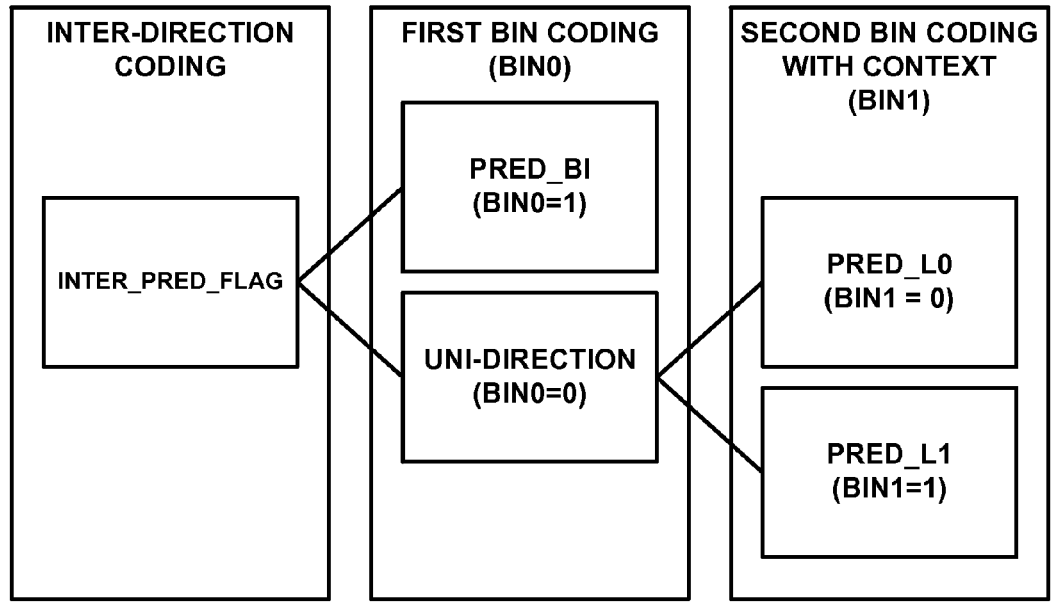
FIG. 8A is a block diagram illustrating context coding an inter-prediction direction syntax element with three possible values.
Figure 8B:
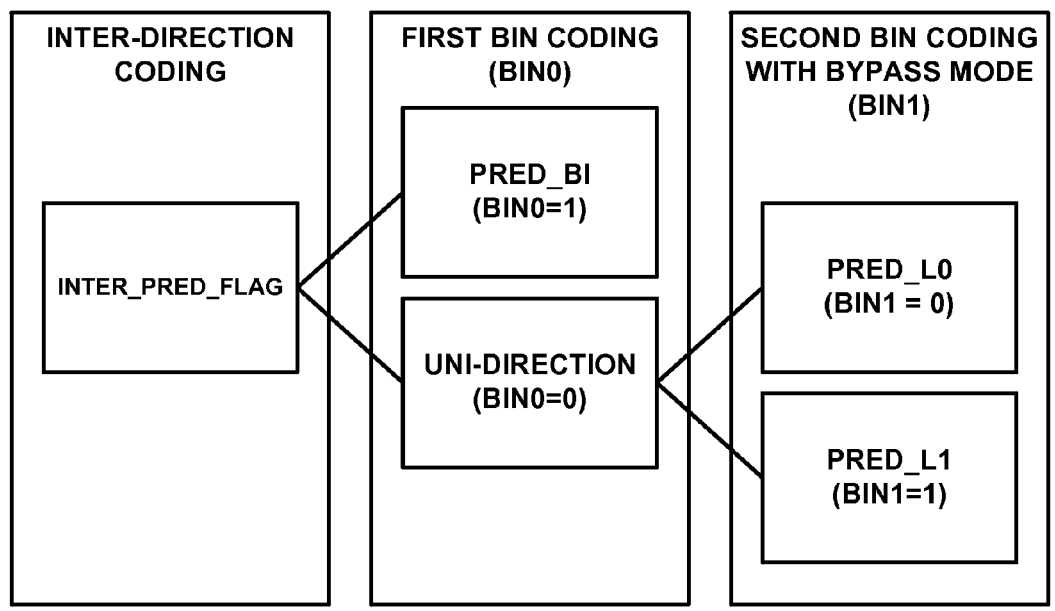
FIG. 8B is a block diagram illustrating bypass coding the inter-prediction direction syntax element, according to aspects of this disclosure.

FIGS. 8A and 8B generally illustrate coding an inter-prediction direction syntax element. For example, as noted above, in addition to calculating the motion vector, motion estimation also determines the index of the reference frame (ref_idx) and the prediction direction for B-slices (inter_pred_idc: forward from L0, backward from L1, or bi-directional, or inter_pred_flag: uni-direction from LC or bi-direction from L0 and L1). The motion vector (e.g., a horizontal component and vertical component of the motion vector), reference frame index, and prediction direction are typically entropy encoded by the encoder as syntax elements, and placed in the encoded video bitstream to be decoded by a video decoder for use in the video decoding process. These syntax elements may be provided for an inter-coded PU to permit the decoder to decode and reproduce video data defined by a PU.

In some instances, list L0 and list L1 references indices may be used to signal reference indices for a bi-direction prediction mode (Pred_BI), and a combined list (LC) reference index is used to signal a reference index for a uni-direction prediction mode (Pred_LC). The LC reference index is the reference index of the combined reference picture list, which includes a combination of reference pictures from the lists L0 and L1 with duplicated reference pictures removed according to a predefined rule (or explicit signaling). The LC reference index, therefore, maps to a reference index for one of List L0 or L1.

In such instances, the inter-prediction direction syntax element (inter_pred_flag) only has two possible values (bi-direction or uni-direction from LC). When the inter-prediction direction syntax element is binarized, only one bin may need to be coded to indicate the inter-prediction direction as either bi-direction or uni-direction. Table 8, shown below, illustrates the inter-prediction direction syntax element:

TABLE 8

| slice_type | inter_pred_flag | Name of inter_pred flag |
|---|---|---|
| P | inferred | Pred_L0 |
| B | 0 | Pred_LC |
| | 1 | Pred_BI |

In other examples, as proposed in a submission by T. Lee and J. Park, "On Reference List Combination," JCTVC-I0125, Geneva, April 2012, the combined list (LC) may be removed. In such examples, instead using an inter-prediction direction syntax element (inter_pred_flag or inter_pred_idc) with three possible values (bi-direction, uni-directional from L0, or uni-direction from L1). When the prediction mode is the uni-direction prediction mode, an additional bin indicating either Pred_L0 or Pred_L1 may need to be coded.

Table 9 illustrates the change in the inter-prediction direction syntax element coding (relative to Table 8 above):

TABLE 9

| slice_type | inter_pred_idc | Name of inter_pred idc |
|---|---|---|
| P | inferred | Pred_L0 |
| B | 0 | Pred_L0 |
| | 1 | Pred_L1 |
| | 2 | Pred_BI |

FIG. 8A illustrates the coding structure described above with respect to Table 9. As shown in FIG. 8A, the inter-prediction direction syntax element (inter_pred_flag) may be coded with a CABAC process using two bins. The first bin (bin(0)) indicates whether the inter-prediction mode is uni-direction (bin(0)=0) or bi-direction (pred_BI) (bin(0)=1). The second bin is conditionally coded only if the first bin indicates the uni-direction prediction mode. The second bin (bin(1)) indicates whether the uni-direction prediction mode is from List0 (pred_L0) (bin(1)=0) or from List1 (pred_L1) (bin(1)=1).

The context model index derivation for the inter-prediction direction having only two possible values (bi-direction or uni-direction from LC) may be determined based on CU depth, which can have values in a range 0 . . . 3 for the first bin (bin0), as shown in the equation below:

ctxIdx=cuDepth

In the example of FIG. 8A, the second bin (bin(1)) may be coded with additional context, or may be coded by reusing one context of the first bin (bin(0)). However, introducing an additional context may increase the complexity associated with coding the inter-prediction direction syntax element. Moreover, reusing one of the contexts of the first bin may reduce the number of contexts used for coding bin0, and the video coder must perform an extra check for this condition.

FIG. 8B is a block diagram illustrating bypass coding the inter-prediction direction syntax element, according to aspects of this disclosure. As shown in FIG. 8B, the first bin (bin(0)) of the inter-prediction direction syntax element (inter_pred_flag) may be context coded with a CABAC process, and the second bin (bin(1)) may be coded with a bypass mode of the CABAC process. The first bin (bin(0)) indicates whether the inter-prediction mode is uni-direction (bin(0)=0) or bi-direction (pred_BI) (bin(0)=1). In this example, bin(0) may be coded using one of four possible contexts, ctxIdx=0 . . . 3. The second bin (bin(1)) may be conditionally coded only if the first bin indicates the uni-direction prediction mode. The second bin (bin(1)) indicates whether the uni-direction prediction mode is from List0 (pred_L0) (bin(1)=0) or from List1 (pred_L1) (bin(1)=1). According to aspects of this disclosure, bin(1) may be coded using no contexts (e.g., coded using a bypass mode of the CABAC process).

In this way, according to aspects of this disclosure, a video coder (e.g., video encoder 20 or video decoder 30), may binarize an inter-prediction direction value and code at least one bin of the binarized inter-prediction direction value with a bypass mode. More specifically, the video coder may select a context to context code the first bin (bin(0)) for the inter-prediction direction value with a CABAC process, and code the second bin (bin(1)) with a bypass mode of the CABAC process. Alternatively, the techniques enable the video coder to code the first bin (bin(0)) for the inter-prediction direction value with the bypass mode and also code the second bin (bin(1)) with the bypass mode. Accordingly, the four contexts available to code bin(0), ctxIdx=0 . . . 3, may be saved.

The techniques enable coding of the inter-prediction direction syntax element with three possible values (bi-direction, uni-directional from L0, or uni-direction from L1) without requiring any extra context or reusing context (e.g., context of bin0). Moreover, the techniques use the bypass mode with no contexts required, which may be less computationally complex than context coding.

Figure 9:
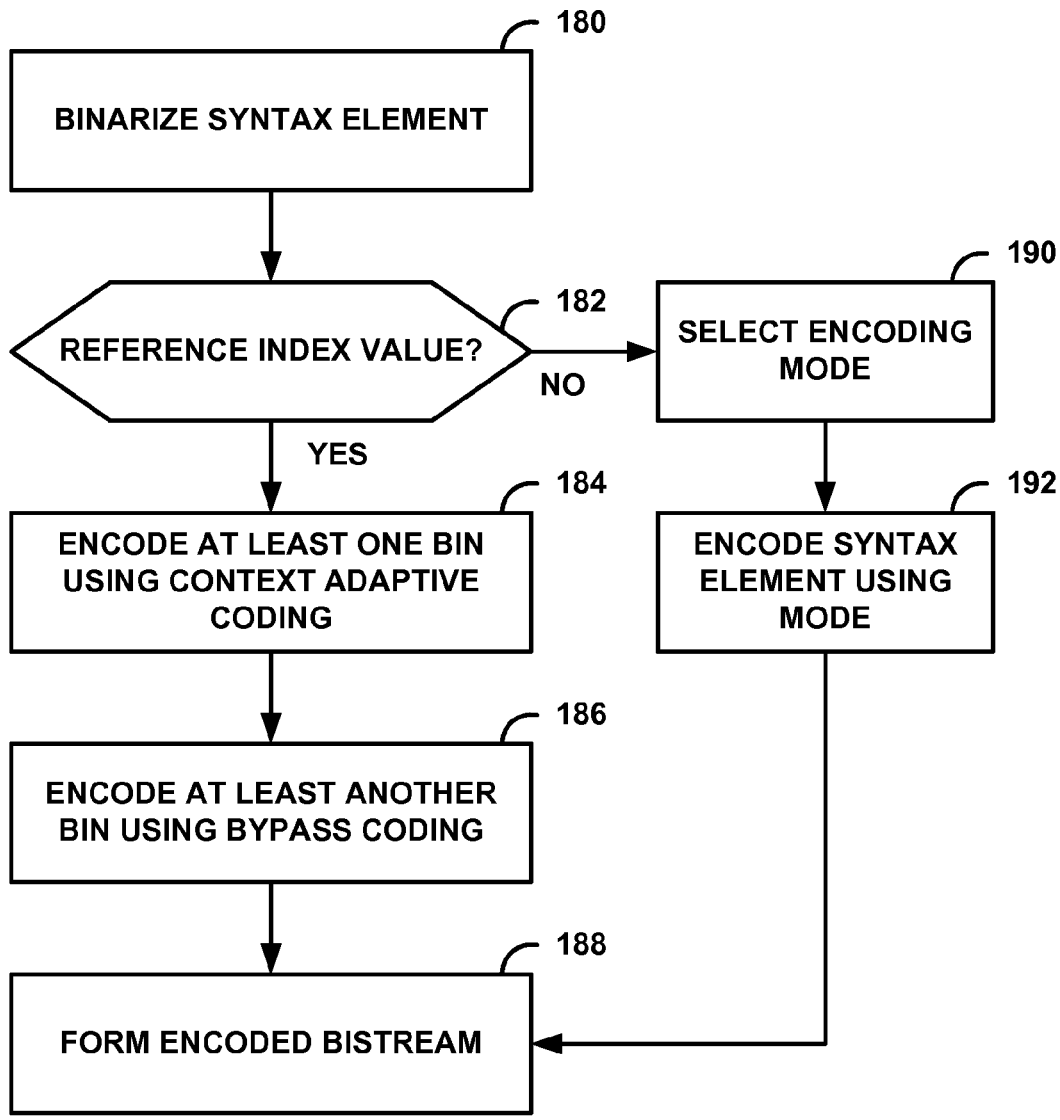
FIG. 9 is a flowchart illustrating an example of entropy encoding a reference index value, according to aspects of this disclosure.

FIG. 9 is a flowchart illustrating an example of entropy encoding a reference index value, according to aspects of this disclosure. Although generally described as performed by components of video encoder 20 (FIGS. 1 and 2) for purposes of explanation, it should be understood that other video coding units, processors, processing units, hardware-based coding units such as encoder/decoders (CODECs), and the like, may also be configured to perform the process of FIG. 9.

In the example of FIG. 9, video encoder 20 binarizes a received syntax element (180). Video encoder 20 may binarize the syntax element according to any of the binariazation processes described in this disclosure. Example binariazation processes include unary, truncated unary, exponential-Golomb, or the like.

Video encoder 20 determines whether the binarized syntax element is a reference index value (182). Again, a reference index value generally identifies a reference picture in a reference picture list for purposes of inter-prediction. If the binarized syntax element is a reference index value (the "yes" branch of step 182), video encoder 20 may encode at least one bin of the binarized reference index value using context adaptive coding, such as CABAC (184). In addition, video encoder 20 may encode at least another bin of the binarized reference index value (in instances in which there are additional bins to be coded) using bypass coding, which bypasses the context adaptive coding engine (186).

As described above with respect to FIG. 4, video encoder 20 may, in some examples, code one, two, or three bins using context coding. For the context coded bins, video encoder 20 may select a context based a relative position of the bin in the bin string. For example, video encoder 20 may select a context for a first bin that is different than a context for a second bin.

In any case, video encoder 20 may combine the context coded bins and bypass coded bins to form an encoded bitstream 188. In some examples, if the syntax element being coded is not a reference index value (the "no" branch of step 182), video encoder 20 may select a particular coding mode (e.g., bypass or context adaptive) to code the syntax element (190). Video encoder 20 may encode the syntax element using the selected mode (192) and form an encoded bitstream (188).

It should also be understood that the steps shown and described with respect to FIG. 9 are provided as merely one example. That is, the steps of the method of FIG. 9 need not necessarily be performed in the order shown in FIG. 9, and fewer, additional, or alternative steps may be performed. For example, video encoder 20 may, in some instances, determine whether the syntax element is a reference index (step 182) prior to binarizing the syntax element (step 180).

Figure 10:
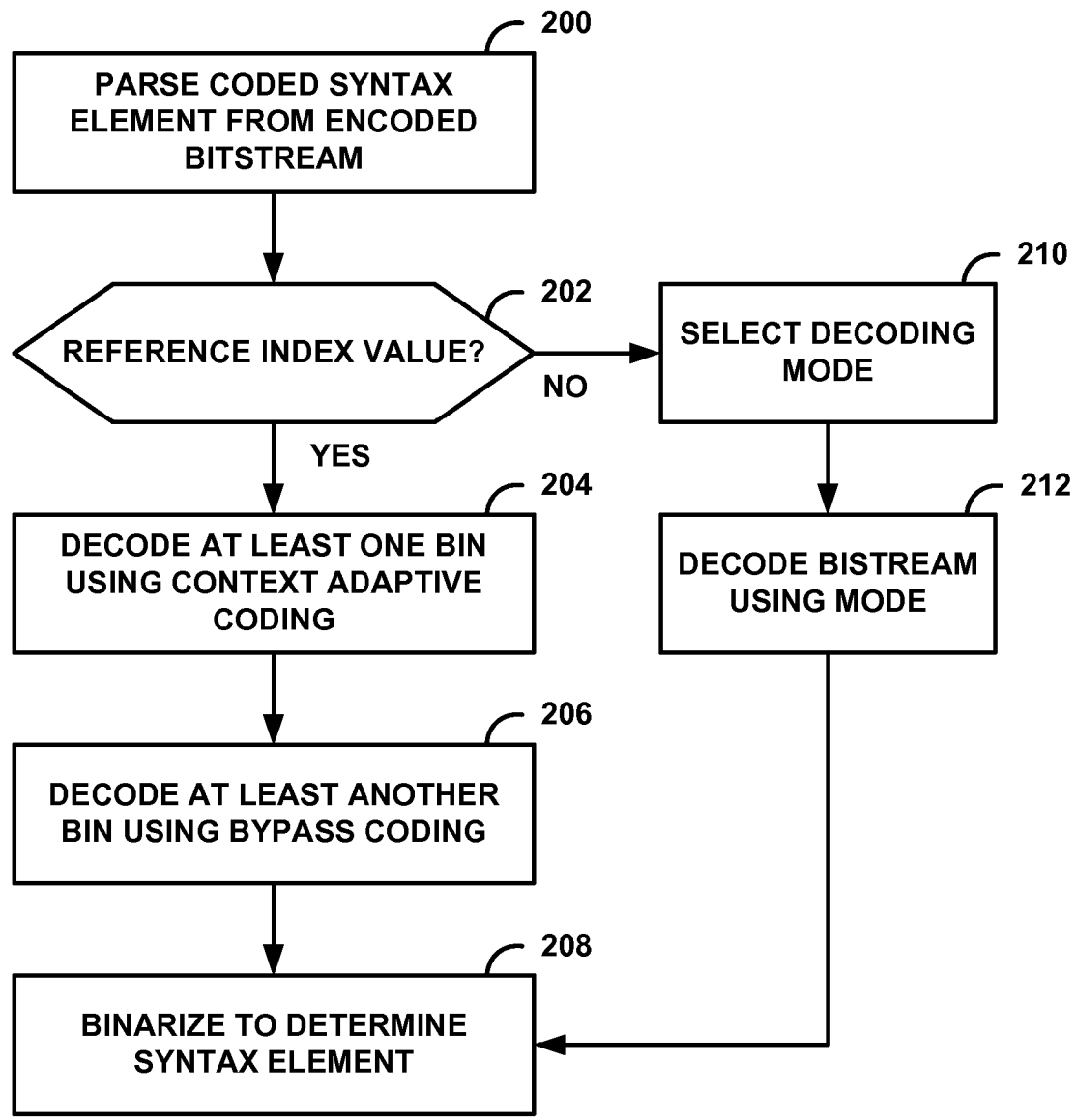
FIG. 10 is a flowchart illustrating an example of entropy decoding a reference index value, according to aspects of this disclosure.

FIG. 10 is a flowchart illustrating an example of entropy decoding a reference index value, according to aspects of this disclosure. Although generally described as performed by components of video decoder 30 (FIGS. 1 and 3) for purposes of explanation, it should be understood that other video coding units, processors, processing units, hardware-based coding units such as encoder/decoders (CODECs), and the like, may also be configured to perform the process of FIG. 12.

Video decoder 30 may initially parse a coded syntax element from an encoded bitstream (200). For example, video decoder 30 may read and segment a coded syntax element from an encoded bitstream according to a particular parsing process (e.g., wavefront parsing). The coded syntax element may include a plurality of coded bins, i.e., binary values.

Video decoder 30 may also determine whether portion of the bitstream currently being decoded is a reference index value (202). If video decoder 30 is decoding a reference index value (the "yes" branch of step 202), video decoder 30 may decode at least one bin using context adaptive coding (206). In addition, video decoder 30 may decode at least another bin (in instances in which there are additional bins to be coded) using bypass coding (208). As noted above with respect to FIG. 9, video decoder 30 may, in some examples, code one, two, or three bins using context coding. For the context coded bins, video decoder 30 may select a context based a relative position of the bin in the bin string. For example, video decoder 30 may select a context for a first bin that is different than a context for a second bin.

After decoding the bins to produce decoded binary values, video decoder 30 may binarize the decoded bin string to produce a decoded syntax element (208). For example, video decoder 30 may map the decoded bin string to a syntax element using a predetermined process. That is, in some instances, video decoder 30 may receive an indication that a particular bin is the final bin for a syntax element. Upon completing the syntax element, then, video decoder 30 may map the bin string to a syntax element using a binarization table.

In some examples, if the syntax element being coded is not a reference index value (the "no" branch of step 202), video decoder 30 may select a particular coding mode (e.g., bypass or context adaptive) to code the syntax element (210). Video decoder 30 may decode the syntax element using the selected mode (212) and binarize the decoded bin string (208).

It should also be understood that the steps shown and described with respect to FIG. 10 are provided as merely one example. That is, the steps of the method of FIG. 10 need not necessarily be performed in the order shown in FIG. 10, and fewer, additional, or alternative steps may be performed.

Figure 11:
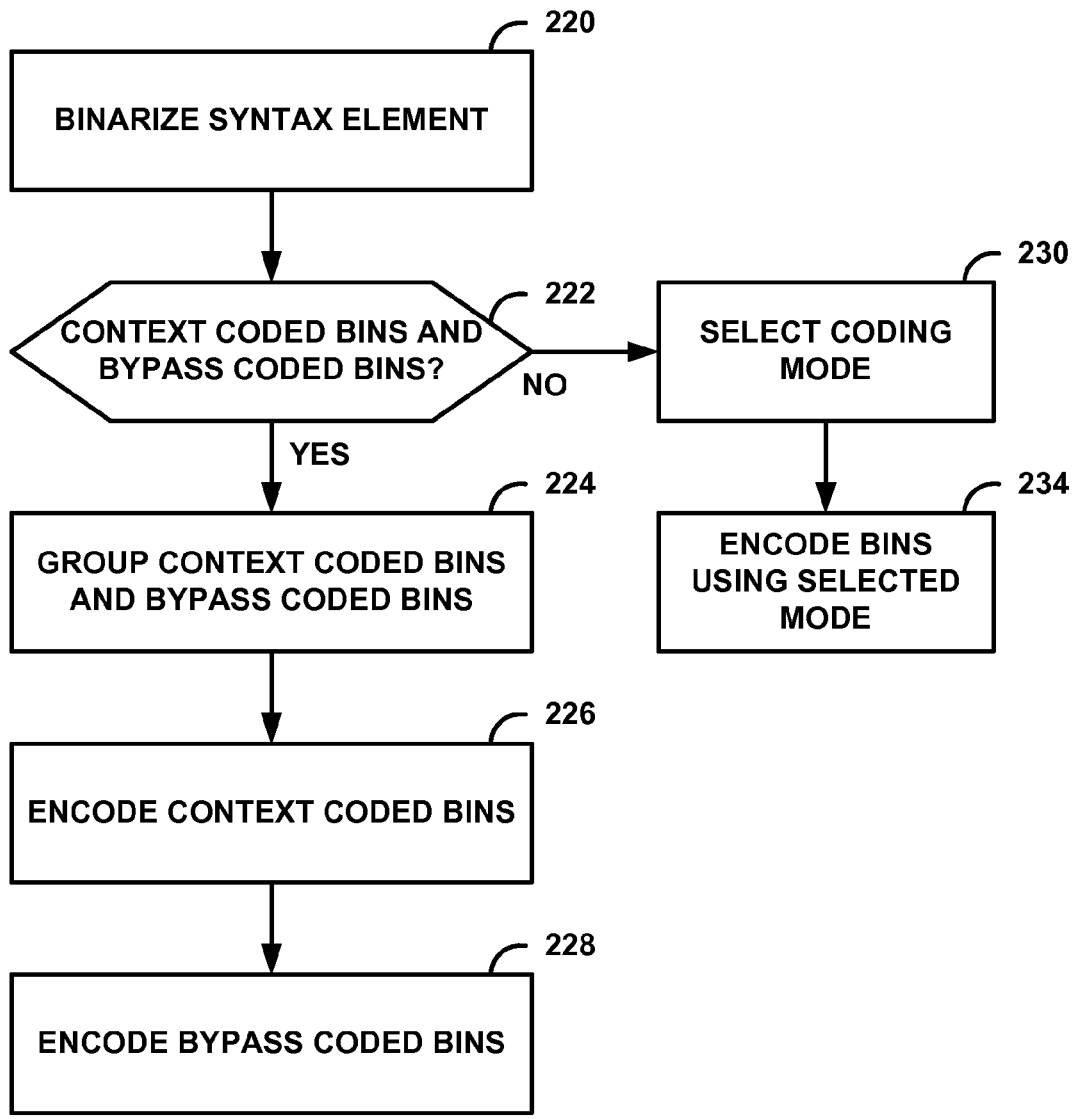
FIG. 11 is a flowchart illustrating an example of entropy encoding prediction data, according to aspects of this disclosure.

FIG. 11 is a flowchart illustrating an example of entropy encoding prediction data, according to aspects of this disclosure. Although generally described as performed by components of video encoder 20 (FIGS. 1 and 2) for purposes of explanation, it should be understood that other video coding units, processors, processing units, hardware-based coding units such as encoder/decoders (CODECs), and the like, may also be configured to perform the process of FIG. 9.

In the example of FIG. 11, video encoder 20 may binarize one or more syntax elements currently being coded (220). For example, video encoder 20 may binarize prediction data including one or more reference indexes, motion vectors, motion vector predictors, motion vector predictor indexes, motion vector difference values, and the like.

In any case, video encoder 20 may determine whether the syntax elements being coded include bins for context coding and bins for bypass coding (222). That is, video encoder 20 may determine whether the bins of a syntax element are coded using a mix of context adaptive coding and bypass coding. If there is a mix of both context coding and bypass coding (the "yes" branch of step 222), video encoder 20 may group context coded bins and bypass coded bins (224). For example, video encoder 20 may separate the context coded bins from the bypass coded bins.

Video encoder 20 may then encode the context coded bins using, for example, a context adaptive coding process (e.g., such as CABAC) (226). In addition, video encoder 20 may encode the bypass coded bins using a bypass mode (226). The bypass mode may bypass the context adaptive coding engine and use a fixed probability to code the bins.

If the syntax element being coded does not include both context coded bins and bypass coded bins (the "no" branch of step 222), video encoder 20 may select a particular coding mode (e.g., bypass or context adaptive) to code the syntax element (230). Video encoder 20 may then encode the syntax element using the selected mode (234).

In some instances, the bin grouping described with respect to FIG. 11 may be performed for more than two syntax elements. For example, as described above with respect to FIG. 7, all of the context coded bins associated with a PU may be grouped, such that the context coded bins of the PU are coded together and the bypass coded bins of the PU are coded together. In addition, grouping may be performed on a CU, LCU, or slice level. That is, in some examples, all of the context coded bins for a CU/LCU/slice may be grouped and coded together, thereby enabling video encoder 20 to make a single transition between context coding and bypass coding.

It should also be understood that the steps shown and described with respect to FIG. 11 are provided as merely one example. That is, the steps of the method of FIG. 11 need not necessarily be performed in the order shown in FIG. 11, and fewer, additional, or alternative steps may be performed. For example, while FIG. 11 shows video encoder 20 encoding context coded bins prior to bypass coded bins, in other examples, video encoder 20 may code bypass coded bins prior to context coded bins.

Figure 12:
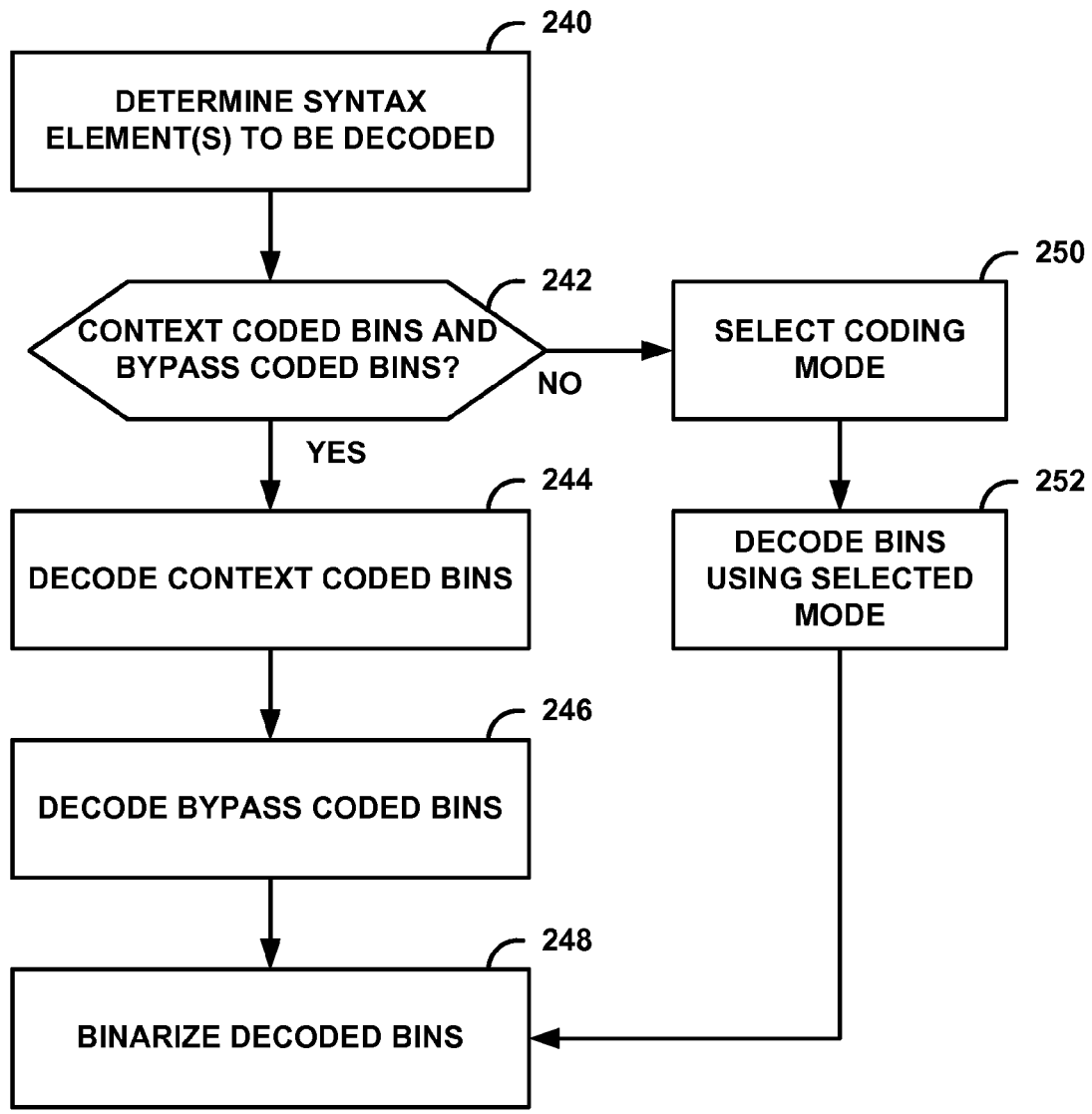
FIG. 12 is a flowchart illustrating an example of entropy decoding prediction data, according to aspects of this disclosure.

FIG. 12 is a flowchart illustrating an example of entropy decoding prediction data, according to aspects of this disclosure. Although generally described as performed by components of video decoder 30 (FIGS. 1 and 3) for purposes of explanation, it should be understood that other video coding units, processors, processing units, hardware-based coding units such as encoder/decoders (CODECs), and the like, may also be configured to perform the process of FIG. 12.

In the example of FIG. 12, video decoder 30 may determine the syntax element (or elements) to be decoded (240). In an example, video decoder 30 may identify syntax elements associated with prediction data for decoding. Video decoder 30 may also determine whether bins of the syntax element(s) include context coded bins and bypass coded bins (242). If there is a mix of both context coding and bypass coding (the "yes" branch of step 242), video decoder 30 may decode the context coded bins (244). Video decoder 30 may also decode, separately from the context coded bins, the bypass coded bins (246). That is, in instances in which context coded bins are grouped separately from the bypass coded bins in the bitstream being decoded, video decoder 30 may decode all context coded separately from decoding bypass coded bins. After decoding the bins, video decoder 30 may binarize the decoded bins to form a decoded syntax element (248). For example, video decoder 30 may map the decoded bin string to a syntax element using a binarization table or other binarization process.

If the syntax element being coded does not include both context coded bins and bypass coded bins (the "no" branch of step 242), video decoder 30 may select a particular coding mode (e.g., bypass or context adaptive) to code the syntax element (250). Video decoder 30 may then decode the encoded bins using the selected mode (252), and binarize the decoded bin string to form a decoded syntax element (248).

As described above with respect to FIG. 11, in some instances, bin grouping may be performed for more than two syntax elements. For example, grouping may be performed on a PU, CU, LCU, or slice level. That is, in some examples, all of the context coded bins for a PU/CU/LCU/slice may be grouped and coded together, thereby enabling video decoder 30 to make a single transition between context coding and bypass coding.

It should also be understood that the steps shown and described with respect to FIG. 12 are provided as merely one example. That is, the steps of the method of FIG. 12 need not necessarily be performed in the order shown in FIG. 12, and fewer, additional, or alternative steps may be performed. For example, while FIG. 12 shows video decoder 30 decoding context coded bins prior to bypass coded bins, in other examples, video decoder 30 may decode bypass coded bins prior to context coded bins.

It should also be understood that, depending on the example, certain acts or events of any of the methods described herein can be performed in a different sequence, may be added, merged, or left out all together (e.g., not all described acts or events are necessary for the practice of the method). Moreover, in certain examples, acts or events may be performed concurrently, e.g., through multi-threaded processing, interrupt processing, or multiple processors, rather than sequentially. In addition, while certain aspects of this disclosure are described as being performed by a single module or unit for purposes of clarity, it should be understood that the techniques of this disclosure may be performed by a combination of units or modules associated with a video coder.

Video encoder 20 may implement any or all of the techniques of this disclosure for coding a reference index and other syntax elements in a video encoding process. Likewise, video decoder 30 may implement any or all of these techniques for coding reference index and other syntax elements in a video coding process. A video coder, as described in this disclosure, may refer to a video encoder or a video decoder. Similarly, a video coding unit may refer to a video encoder or a video decoder. Likewise, video coding may refer to video encoding or video decoding.

In one or more examples, the functions described in this disclosure and attributed to video encoder 20, video decoder 30, or any other processing unit may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry, or any combination thereof. Video encoder 20 or video decoder 30 may include any of a variety of such one or more processors configured to perform the functions described in this disclosure. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method for encoding a reference picture index syntax element in a video encoding process, the method comprising:
   binarizing a reference picture index value;
   encoding at least one bin of the binarized reference picture index value with a context coding mode of a context-adaptive binary arithmetic coding (CABAC) process;
   determining that the binarized reference picture index value comprises more bins than the at least one bin coded with the context coded mode; and
   encoding, in response to determining that the binarized reference picture index value comprises more bins than the at least one bin coded with the context coded mode, at least another bin of the binarized reference picture index value with a bypass coding mode of the CABAC process.

2. The method of claim 1,
   wherein encoding at least one bin of the binarized reference picture index value with the context coding mode comprises:
   encoding a first bin (bin0) of the binarized reference picture index value with a first context (ctx0),
   encoding a second bin (bin1) of the binarized reference picture index with a second context (ctx1), and
   wherein encoding at least another bin of the binarized reference picture index value with the bypass coding mode comprises:
   encoding a third bin (bin2) and all remaining bins after the third bin (bin2) with the bypass coding mode.

3. The method of claim 2, wherein binarizing the reference picture index value comprises binarizing the reference picture index value using a combined truncated unary and exponential Golomb code.

4. The method of claim 1, wherein encoding the at least another bin of the binarized reference picture index value with the bypass coding mode comprises encoding the at least another bin with at least one of a unary, truncated unary, Golomb, exponential Golomb, or Golomb-Rice coding process.

5. The method of claim 1, further comprising:
   binarizing components of a first motion vector difference value associated with the first reference picture index and components of a second motion vector difference value associated with a second reference picture index;
   encoding a first portion of the components of first motion vector difference value and a first portion of the components of the second motion vector difference value with the context coding mode; and encoding a second portion of the components of the first motion vector difference value and a second portion of the components of the second motion vector difference value with the bypass coding mode.

6. The method of claim 5, further comprising:
grouping the first portion of the components of the first motion vector difference value and the first portion of the components of the second motion vector difference value into a first group for coding with the context coding mode, and
grouping the second portion of the components of first motion vector difference value and the second portion of components of the second motion vector difference value into a second group for coding with the bypass coding mode.

7. The method of claim 1,
wherein encoding at least one bin of the binarized reference picture index value with the context coding mode comprises:
encoding a first bin (bin0) of the binarized reference picture index value with a first context (ctx0),
encoding a second bin (bin1) of the binarized reference picture index with a second context (ctx1),
encoding a third bin (bin2) of the binarized reference picture index with a third context (ctx2), and
wherein encoding at least another bin of the binarized reference picture index value with the bypass coding mode comprises:
encoding all remaining bins after the third bin (bin2) with the bypass coding mode.

8. The method of claim 1,
wherein encoding at least one bin of the binarized reference picture index value with the context coding mode comprises:
encoding a first bin (bin0) of the binarized reference picture index value with a first context (ctx0), and
wherein encoding at least another bin of the binarized reference picture index value with the bypass coding mode comprises:
encoding all remaining bins after the first bin (bin0) with the bypass coding mode.

9. The method of claim 1,
wherein binarizing the reference picture index value comprises unary coding the reference picture index value;
wherein encoding the at least one bin of the binarized reference picture index value with the context coding mode comprises:
encoding at least one bin of the unary coded reference picture index value with the context coding mode; and
wherein encoding the at least another bin of the binarized reference picture index value with the bypass coding mode comprises:
encoding at least another bin of the unary coded reference picture index value with the bypass coding mode.

10. The method of claim 9, wherein unary coding the reference picture index value comprises truncated unary coding the reference picture index value.

11. The method of claim 1, wherein
binarizing the reference picture index value comprises unary coding and exponential-Golomb coding the reference picture index value;
wherein encoding the at least one bin of the binarized reference picture index value with the context coding mode comprises:
encoding at least one bin of a unary coded portion of the reference picture index value with the context coding mode; and
wherein encoding the at least another bin of the binarized reference picture index value with the bypass coding mode comprises:
encoding at least another bin of the unary coded portion of the reference picture index value and an exponential-Golomb coded portion of the reference picture index value with the bypass coding mode.

12. The method of claim 11, further comprising truncating the exponential-Golomb coded portion of the reference picture index value prior to encoding the exponential-Golomb coded portion of the reference picture index value.

13. The method of claim 1,
wherein binarizing the reference picture index value comprises unary coding and fixed length coding the reference picture index value;
wherein encoding the at least one bin of the binarized reference picture index value with the context coding mode comprises encoding at least one bin of a unary coded portion of the reference picture index value with the context coding mode; and
wherein encoding the at least another bin of the binarized reference picture index value with the bypass coding mode comprises encoding at least another bin of the unary coded portion reference picture index value and a fixed length coded portion of the reference picture index value with the bypass coding mode.

14. The method of claim 13, further comprising truncating the fixed length coded portion of the reference picture index value prior to coding the fixed length coded portion of the reference picture index value.

15. The method of claim 1,
wherein encoding with the context coding mode comprises selecting one or more probability models for coding the at least one bin of the binarized reference picture index and encoding the at least one bin of the binarized reference picture index using the selected one or more probability models; and
wherein encoding with the bypass coding mode comprises determining a fixed probability and encoding the at least another bin of the binarized reference picture index value using the fixed probability.

16. An apparatus for encoding a reference picture index syntax element in a video encoding process, the apparatus comprising:
a decoded picture buffer configured to store one or more reference pictures; and
one or more processors to:
binarize a reference picture index value for a reference picture of the one or more reference pictures;
encode at least one bin of the binarized reference picture index value with a context coding mode of a context-adaptive binary arithmetic coding (CABAC) process;
determine that the binarized reference picture index value comprises more bins than the at least one bin coded with the context coded mode; and
encode, in response to determining that the binarized reference picture index value comprises more bins than the at least one bin coded with the context coded mode, at least another bin of the binarized reference picture index value with a bypass coding mode of the CABAC process.

17. The apparatus of claim 16,
wherein to encode at least one bin of the binarized reference picture index value with the context coding mode, the one or more processors are configured to:
encode a first bin (bin0) of the binarized reference picture index value with a first context (ctx0),
encode a second bin (bin1) of the binarized reference picture index with a second context (ctx1), and
wherein to encode at least another bin of the binarized reference picture index value with the bypass coding mode, the one or more processors are configured to:
encode a third bin (bin2) and all remaining bins after the third bin (bin2) with the bypass coding mode.

18. The apparatus of claim 17, wherein to binarize the reference picture index value, the one or more processors are configured to binarize the reference picture index value using a combined truncated unary and exponential Golomb code.

19. The apparatus of claim 16, wherein to encode the at least another bin of the binarized reference picture index value with the bypass coding mode, the one or more processors are configured to encode the at least another bin with at least one of a unary, truncated unary, Golomb, exponential Golomb, or Golomb-Rice coding process.

20. The apparatus of claim 16, wherein the one or more processors are further configured to:
binarize components of a first motion vector difference value associated with the first reference picture index and components of a second motion vector difference value associated with a second reference picture index;
encode a first portion of the components of first motion vector difference value and a first portion of the components of the second motion vector difference value with the context coding mode; and
encode a second portion of the components of the first motion vector difference value and a second portion of the components of the second motion vector difference value with the bypass coding mode.

21. The apparatus of claim 20, wherein the one or more processors are further configured to:
group the first portion of the components of the first motion vector difference value and the first portion of the components of the second motion vector difference value into a first group for coding with the context coding mode, and
group the second portion of the components of first motion vector difference value and the second portion of components of the second motion vector difference value into a second group for coding with the bypass coding mode.

22. The apparatus of claim 16,
wherein to encode at least one bin of the binarized reference picture index value with the context coding mode, the one or more processors are configured to:
encode a first bin (bin0) of the binarized reference picture index value with a first context (ctx0),
encode a second bin (bin1) of the binarized reference picture index with a second context (ctx1),
encode a third bin (bin2) of the binarized reference picture index with a third context (ctx2), and
wherein to encode at least another bin of the binarized reference picture index value with the bypass coding mode, the one or more processors are configured to:
encode all remaining bins after the third bin (bin2) with the bypass coding mode.

23. The apparatus of claim 16,
wherein to encode at least one bin of the binarized reference picture index value with the context coding mode, the one or more processors are configured to:
encode a first bin (bin0) of the binarized reference picture index value with a first context (ctx0), and
wherein to encode at least another bin of the binarized reference picture index value with the bypass coding mode, the one or more processors are configured to:
encode all remaining bins after the first bin (bin0) with the bypass coding mode.

24. The apparatus of claim 16,
wherein to binarize the reference picture index value, the one or more processors are configured to unary code the reference picture index value;
wherein to encode the at least one bin of the binarized reference picture index value with the context coding mode, the one or more processors are configured to:
encode at least one bin of the unary coded reference picture index value with the context coding mode; and
wherein to encode the at least another bin of the binarized reference picture index value with the bypass coding mode, the one or more processors are configured to:
encode at least another bin of the unary coded reference picture index value with the bypass coding mode.

25. The apparatus of claim 24, wherein to unary code the reference picture index value, the one or more processors are configured to truncated unary code the reference picture index value.

26. The apparatus of claim 16,
wherein to binarize the reference picture index value, the one or more processors are configured to unary code and exponential-Golomb code the reference picture index value;
wherein to encode the at least one bin of the binarized reference picture index value with the context coding mode, the one or more processors are configured to:
encode at least one bin of a unary coded portion of the reference picture index value with the context coding mode; and
wherein to encode the at least another bin of the binarized reference picture index value with the bypass coding mode, the one or more processors are configured to:
encode at least another bin of the unary coded portion of the reference picture index value and an exponential-Golomb coded portion of the reference picture index value with the bypass coding mode.

27. The apparatus of claim 26, wherein the one or more processors are further configured to truncate the exponential-Golomb coded portion of the reference picture index value prior to encoding the exponential-Golomb coded portion of the reference picture index value.

28. The apparatus of claim 16,
wherein to binarize the reference picture index value, the one or more processors are configured to unary code and fixed length code the reference picture index value;
wherein to encode the at least one bin of the binarized reference picture index value with the context coding mode, the one or more processors are configured to encode at least one bin of a unary coded portion of the reference picture index value with the context coding mode; and
wherein to encode the at least another bin of the binarized reference picture index value with the bypass coding mode, the one or more processors are configured to encode at least another bin of the unary coded portion reference picture index value and a fixed length coded portion of the reference picture index value with the bypass coding mode.

29. The apparatus of claim 28, wherein the one or more processors are further configured to truncate the fixed length coded portion of the reference picture index value prior to coding the fixed length coded portion of the reference picture index value.

30. The apparatus of claim 16,
wherein to encode with the context coding mode, the one or more processors are configured to select one or more probability models for coding the at least one bin of the binarized reference picture index and encode the at least one bin of the binarized reference picture index using the selected one or more probability models; and
wherein to encode with the bypass coding mode, the one or more processors are configured to determine a fixed probability and encode the at least another bin of the binarized reference picture index value using the fixed probability.

31. An apparatus for encoding a reference picture index syntax element in a video encoding process, the apparatus comprising:
means for binarizing a reference picture index value;
means for encoding at least one bin of the binarized reference picture index value with a context coding mode of a context-adaptive binary arithmetic coding (CABAC) process;
means for determining that the binarized reference picture index value comprises more bins than the at least one bin coded with the context coded mode; and
means for encoding, in response to determining that the binarized reference picture index value comprises more bins than the at least one bin coded with the context coded mode, at least another bin of the binarized reference picture index value with a bypass coding mode of the CABAC process.

32. The apparatus of claim 31,
wherein the means for encoding at least one bin of the binarized reference picture index value with the context coding mode comprises:
means for encoding a first bin (bin0) of the binarized reference picture index value with a first context (ctx0),
means for encoding a second bin (bin1) of the binarized reference picture index with a second context (ctx1), and
wherein the means for encoding at least another bin of the binarized reference picture index value with the bypass coding mode comprises:
means for encoding a third bin (bin2) and all remaining bins after the third bin (bin2) with the bypass coding mode.

33. The apparatus of claim 32, wherein the means for binarizing the reference picture index value comprises means for binarizing the reference picture index value using a combined truncated unary and exponential Golomb code.

34. The apparatus of claim 31, wherein the means for encoding the at least another bin of the binarized reference picture index value with the bypass coding mode comprises means for encoding the at least another bin with at least one of a unary, truncated unary, Golomb, exponential Golomb, or Golomb-Rice coding process.

35. The apparatus of claim 31, further comprising:
means for binarizing components of a first motion vector difference value associated with the first reference picture index and components of a second motion vector difference value associated with a second reference picture index;
means for encoding a first portion of the components of first motion vector difference value and a first portion of the components of the second motion vector difference value with the context coding mode; and
means for encoding a second portion of the components of the first motion vector difference value and a second portion of the components of the second motion vector difference value with the bypass coding mode.

36. The apparatus of claim 35, further comprising:
means for grouping the first portion of the components of the first motion vector difference value and the first portion of the components of the second motion vector difference value into a first group for coding with the context coding mode, and
means for grouping the second portion of the components of first motion vector difference value and the second portion of components of the second motion vector difference value into a second group for coding with the bypass coding mode.

37. The apparatus of claim 31,
wherein the means for encoding at least one bin of the binarized reference picture index value with the context coding mode comprises:
means for encoding a first bin (bin0) of the binarized reference picture index value with a first context (ctx0),
means for encoding a second bin (bin1) of the binarized reference picture index with a second context (ctx1),
means for encoding a third bin (bin2) of the binarized reference picture index with a third context (ctx2), and
wherein the means for encoding at least another bin of the binarized reference picture index value with the bypass coding mode comprises:
means for encoding all remaining bins after the third bin (bin2) with the bypass coding mode.

38. The apparatus of claim 31,
wherein the means for encoding at least one bin of the binarized reference picture index value with the context coding mode comprises:
means for encoding a first bin (bin0) of the binarized reference picture index value with a first context (ctx0), and
wherein the means for encoding at least another bin of the binarized reference picture index value with the bypass coding mode comprises:
means for encoding all remaining bins after the first bin (bin0) with the bypass coding mode.

39. The apparatus of claim 31,
wherein the means for binarizing the reference picture index value comprises means for unary coding the reference picture index value;
wherein the means for encoding the at least one bin of the binarized reference picture index value with the context coding mode comprises:
means for encoding at least one bin of the unary coded reference picture index value with the context coding mode; and
wherein the means for encoding the at least another bin of the binarized reference picture index value with the bypass coding mode comprises:
means for encoding at least another bin of the unary coded reference picture index value with the bypass coding mode.

40. The apparatus of claim 39, wherein the means for unary coding the reference picture index value comprises means for truncated unary coding the reference picture index value.

41. The apparatus of claim 31,
wherein the means for binarizing the reference picture index value comprises means for unary coding and exponential-Golomb coding the reference picture index value;
wherein the means for encoding the at least one bin of the binarized reference picture index value with the context coding mode comprises:
means for encoding at least one bin of a unary coded portion of the reference picture index value with the context coding mode; and
wherein the means for encoding the at least another bin of the binarized reference picture index value with the bypass coding mode comprises:
means for encoding at least another bin of the unary coded portion of the reference picture index value and an exponential-Golomb coded portion of the reference picture index value with the bypass coding mode.

42. The apparatus of claim 41, further comprising means for truncating the exponential-Golomb coded portion of the reference picture index value prior to encoding the exponential-Golomb coded portion of the reference picture index value.

43. The apparatus of claim 31,
wherein the means for binarizing the reference picture index value comprises means for unary coding and fixed length coding the reference picture index value;
wherein the means for encoding the at least one bin of the binarized reference picture index value with the context coding mode comprises means for encoding at least one bin of a unary coded portion of the reference picture index value with the context coding mode; and
wherein the means for encoding the at least another bin of the binarized reference picture index value with the bypass coding mode comprises means for encoding at least another bin of the unary coded portion reference picture index value and a fixed length coded portion of the reference picture index value with the bypass coding mode.

44. The apparatus of claim 43, further comprising means for truncating the fixed length coded portion of the reference picture index value prior to coding the fixed length coded portion of the reference picture index value.

45. The apparatus of claim 31,
wherein means for encoding with the context coding mode comprises means for selecting one or more probability models for coding the at least one bin of the binarized reference picture index and means for encoding the at least one bin of the binarized reference picture index using the selected one or more probability models; and
wherein means for encoding with the bypass coding mode comprises means for determining a fixed probability and means for encoding the at least another bin of the binarized reference picture index value using the fixed probability.

46. A method for decoding a reference picture index syntax element in a video decoding process, the method comprising:
decoding at least one bin of a reference picture index value with a context coding mode of a context-adaptive binary arithmetic coding (CABAC) process;
determining that the binarized reference picture index value comprises more bins than the at least one bin coded with the context coded mode;
decoding, in response to determining that the reference picture index value comprises more bins than the at least one bin coded with the context coded mode, at least another bin of the reference picture index value with a bypass coding mode of the CABAC process; and
binarizing the reference picture index value.

47. The method of claim 46,
wherein decoding at least one bin of the reference picture index value with the context coding mode comprises:
decoding a first bin (bin0) of the reference picture index value with a first context (ctx0),
decoding a second bin (bin1) of the reference picture index with a second context (ctx1), and
wherein decoding at least another bin of the reference picture index value with the bypass coding mode comprises:
decoding a third bin (bin2) and all remaining bins after the third bin (bin2) with the bypass coding mode.

48. The method of claim 47, wherein binarizing the reference picture index value comprises binarizing the reference picture index value using a combined truncated unary and exponential Golomb code.

49. The method of claim 46, wherein decoding the at least another bin of the reference picture index value with the bypass coding mode comprises decoding the at least another bin with at least one of a unary, truncated unary, Golomb, exponential Golomb, or Golomb-Rice coding process.

50. The method of claim 46, further comprising:
decoding a first portion of components of a first motion vector difference value and a first portion of components of a second motion vector difference value with the context coding mode;
decoding a second portion of the components of the first motion vector difference value and a second portion of the components of the second motion vector difference value with the bypass coding mode; and
binarizing the components of the first motion vector difference value associated with the first reference picture index and the components of the second motion vector difference value associated with a second reference picture index.

51. The method of claim 50, further comprising:
grouping the first portion of the components of the first motion vector difference value and the first portion of the components of the second motion vector difference value into a first group for coding with the context coding mode, and
grouping the second portion of the components of first motion vector difference value and the second portion of components of the second motion vector difference value into a second group for coding with the bypass coding mode.

52. The method of claim 46,
wherein decoding at least one bin of the reference picture index value with the context coding mode comprises:
decoding a first bin (bin0) of the reference picture index value with a first context (ctx0),
decoding a second bin (bin1) of the reference picture index with a second context (ctx1),
decoding a third bin (bin2) of the reference picture index with a third context (ctx2), and
wherein decoding at least another bin of the reference picture index value with the bypass coding mode comprises:
decoding all remaining bins after the third bin (bin2) with the bypass coding mode.

53. The method of claim 46,
wherein decoding at least one bin of the reference picture index value with the context coding mode comprises:
decoding a first bin (bin0) of the reference picture index value with a first context (ctx0), and
wherein decoding at least another bin of the reference picture index value with the bypass coding mode comprises:
decoding all remaining bins after the first bin (bin0) with the bypass coding mode.

54. The method of claim 46,
wherein decoding the at least one bin of the reference picture index value with the context coding mode comprises:
decoding at least one bin of the unary coded reference picture index value with the context coding mode;
wherein decoding the at least another bin of the index value with the bypass coding mode comprises:
decoding at least another bin of the unary coded reference picture index value with the bypass coding mode; and
wherein binarizing the reference picture index value comprises unary coding the reference picture index value.

55. The method of claim 54, wherein unary coding the reference picture index value comprises truncated unary coding the reference picture index value.

56. The method of claim 46,
wherein decoding the at least one bin of the reference picture index value with the context coding mode comprises:
decoding at least one bin of a unary coded portion of the reference picture index value with the context coding mode;
wherein decoding the at least another bin of the reference picture index value with the bypass coding mode comprises:
decoding at least another bin of the unary coded portion of the reference picture index value and an exponential-Golomb coded portion of the reference picture index value with the bypass coding mode; and
wherein binarizing the reference picture index value comprises unary coding and exponential-Golomb coding the reference picture index value.

57. The method of claim 56, further comprising truncating the exponential-Golomb coded portion of the reference picture index value prior to decoding the exponential-Golomb coded portion of the reference picture index value.

58. The method of claim 46,
wherein decoding the at least one bin of the reference picture index value with the context coding mode comprises decoding at least one bin of a unary coded portion of the reference picture index value with the context coding mode;
wherein decoding the at least another bin of the reference picture index value with the bypass coding mode comprises decoding at least another bin of the unary coded portion reference picture index value and a fixed length coded portion of the reference picture index value with the bypass coding mode; and
wherein binarizing the reference picture index value comprises unary coding and fixed length coding the reference picture index value.

59. The method of claim 58, further comprising truncating the fixed length coded portion of the reference picture index value prior to coding the fixed length coded portion of the reference picture index value.

60. The method of claim 46,
wherein decoding with the context coding mode comprises selecting one or more probability models for coding the at least one bin of the binarized reference picture index and decoding the at least one bin of the binarized reference picture index using the selected one or more probability models; and
wherein decoding with the bypass coding mode comprises determining a fixed probability and decoding the at least another bin of the binarized reference picture index value using the fixed probability.

61. An apparatus for decoding a reference picture index syntax element in a video decoding process, the apparatus comprising:
a decoded picture buffer configured to store one or more reference pictures; and
one or more processors configured to:
decode at least one bin of a reference picture index value with a context coding mode of a context-adaptive binary arithmetic coding (CABAC) process, wherein the reference picture index value is associated with a reference picture of the one or more reference pictures;
determine that the binarized reference picture index value comprises more bins than the at least one bin coded with the context coded mode;
decode, in response to determining that the reference picture index value comprises more bins than the at least one bin coded with the context coded mode, at least another bin of the reference picture index value with a bypass coding mode of the CABAC process; and
binarize the reference picture index value.

62. The apparatus of claim 61,
wherein to decode at least one bin of the reference picture index value with the context coding mode, the one or more processors are configured to:
decode a first bin (bin0) of the reference picture index value with a first context (ctx0),
decode a second bin (bin1) of the reference picture index with a second context (ctx1), and
wherein to decode at least another bin of the reference picture index value with the bypass coding mode, the one or more processors are configured to:
decode a third bin (bin2) and all remaining bins after the third bin (bin2) with the bypass coding mode.

63. The apparatus of claim 62, wherein to binarize the reference picture index value, the one or more processors are configured to binarize the reference picture index value using a combined truncated unary and exponential Golomb code.

64. The apparatus of claim 61, wherein to decode the at least another bin of the reference picture index value with the bypass coding mode, the one or more processors are configured to decode the at least another bin with at least one of a unary, truncated unary, Golomb, exponential Golomb, or Golomb-Rice coding process.

65. The apparatus of claim 61, wherein the one or more processors are further configured to:
decode a first portion of components of a first motion vector difference value and a first portion of components of a second motion vector difference value with the context coding mode;
decode a second portion of the components of the first motion vector difference value and a second portion of the components of the second motion vector difference value with the bypass coding mode; and
binarize the components of the first motion vector difference value associated with the first reference picture index and the components of the second motion vector difference value associated with a second reference picture index.

66. The apparatus of claim 65, wherein the one or more processors are further configured to:
group the first portion of the components of the first motion vector difference value and the first portion of the components of the second motion vector difference value into a first group for coding with the context coding mode, and
group the second portion of the components of first motion vector difference value and the second portion of components of the second motion vector difference value into a second group for coding with the bypass coding mode.

67. The apparatus of claim 61,
wherein to decode at least one bin of the reference picture index value with the context coding mode, the one or more processors are configured to:
decode a first bin (bin0) of the reference picture index value with a first context (ctx0),
decode a second bin (bin1) of the reference picture index with a second context (ctx1),
decode a third bin (bin2) of the reference picture index with a third context (ctx2), and
wherein to decode at least another bin of the reference picture index value with the bypass coding mode, the one or more processors are configured to:
decode all remaining bins after the third bin (bin2) with the bypass coding mode.

68. The apparatus of claim 61,
wherein to decode at least one bin of the reference picture index value with the context coding mode, the one or more processors are configured to:
decode a first bin (bin0) of the reference picture index value with a first context (ctx0), and
wherein to decode at least another bin of the reference picture index value with the bypass coding mode, the one or more processors are configured to:
decode all remaining bins after the first bin (bin0) with the bypass coding mode.

69. The apparatus of claim 61,
wherein to decode the at least one bin of the reference picture index value with the context coding mode, the one or more processors are configured to:
decode at least one bin of the unary coded reference picture index value with the context coding mode;
wherein to decode the at least another bin of the index value with the bypass coding mode, the one or more processors are configured to:
decode at least another bin of the unary coded reference picture index value with the bypass coding mode; and
wherein to binarize the reference picture index value, the one or more processors are configured to unary code the reference picture index value.

70. The apparatus of claim 69, wherein to unary code the reference picture index value, the one or more processors are configured to truncated unary code the reference picture index value.

71. The apparatus of claim 61,
wherein to decode the at least one bin of the reference picture index value with the context coding mode, the one or more processors are configured to:
decode at least one bin of a unary coded portion of the reference picture index value with the context coding mode;
wherein to decode the at least another bin of the reference picture index value with the bypass coding mode, the one or more processors are configured to:
decode at least another bin of the unary coded portion of the reference picture index value and an exponential-Golomb coded portion of the reference picture index value with the bypass coding mode; and
wherein to binarize the reference picture index value, the one or more processors are configured to unary code and exponential-Golomb code the reference picture index value.

72. The apparatus of claim 71, wherein the one or more processors are further configured to truncate the exponential-Golomb coded portion of the reference picture index value prior to decoding the exponential-Golomb coded portion of the reference picture index value.

73. The apparatus of claim 61,
wherein to decode the at least one bin of the reference picture index value with the context coding mode, the one or more processors are configured to decode at least one bin of a unary coded portion of the reference picture index value with the context coding mode;
wherein to decode the at least another bin of the reference picture index value with the bypass coding mode, the one or more processors are configured to decode at least another bin of the unary coded portion reference picture index value and a fixed length coded portion of the reference picture index value with the bypass coding mode; and
wherein to binarize the reference picture index value, the one or more processors are configured to unary code and fixed length code the reference picture index value.

74. The apparatus of claim 73, wherein the one or more processors are further configured to truncate the fixed length coded portion of the reference picture index value prior to coding the fixed length coded portion of the reference picture index value.

75. The apparatus of claim 61,
wherein to decode with the context coding mode, the one or more processors are configured to select one or more probability models for coding the at least one bin of the binarized reference picture index and decode the at least one bin of the binarized reference picture index using the selected one or more probability models; and
wherein to decode with the bypass coding mode, the one or more processors are configured to determine a fixed probability and decode the at least another bin of the binarized reference picture index value using the fixed probability.

76. A non-transitory computer-readable medium storing instructions thereon that, when executed cause one or more processors to:
decode at least one bin of a reference picture index value with a context coding mode of a context-adaptive binary arithmetic coding (CABAC) process;
determine that the binarized reference picture index value comprises more bins than the at least one bin coded with the context coded mode;
decode, in response to determining that the reference picture index value comprises more bins than the at least one bin coded with the context coded mode, at least another bin of the reference picture index value with a bypass coding mode of the CABAC process; and
binarize the reference picture index value.

77. The computer-readable medium of claim 76,
wherein to decode at least one bin of the reference picture index value with the context coding mode, the instructions cause the one or more processors to:
decode a first bin (bin0) of the reference picture index value with a first context (ctx0),
decode a second bin (bin1) of the reference picture index with a second context (ctx1), and
wherein to decode at least another bin of the reference picture index value with the bypass coding mode, the instructions cause the one or more processors to:
decode a third bin (bin2) and all remaining bins after the third bin (bin2) with the bypass coding mode.

78. The computer-readable medium of claim 77, wherein to binarize the reference picture index value, the instructions cause the one or more processors to binarize the reference picture index value using a combined truncated unary and exponential Golomb code.

79. The computer-readable medium of claim 76, wherein to decode the at least another bin of the reference picture index value with the bypass coding mode, the instructions cause the one or more processors to decode the at least another bin with at least one of a unary, truncated unary, Golomb, exponential Golomb, or Golomb-Rice coding process.

80. The computer-readable medium of claim 76, further comprising instructions that cause the one or more processors to:
decode a first portion of components of a first motion vector difference value and a first portion of components of a second motion vector difference value with the context coding mode;
decode a second portion of the components of the first motion vector difference value and a second portion of the components of the second motion vector difference value with the bypass coding mode; and
binarize the components of the first motion vector difference value associated with the first reference picture index and the components of the second motion vector difference value associated with a second reference picture index.

81. The computer-readable medium of claim 80, further comprising instructions that cause the one or more processors to:
group the first portion of the components of the first motion vector difference value and the first portion of the components of the second motion vector difference value into a first group for coding with the context coding mode, and
group the second portion of the components of first motion vector difference value and the second portion of components of the second motion vector difference value into a second group for coding with the bypass coding mode.

82. The computer-readable medium of claim 76,
wherein to decode at least one bin of the reference picture index value with the context coding mode, the instructions cause the one or more processors to:
decode a first bin (bin0) of the reference picture index value with a first context (ctx0),
decode a second bin (bin1) of the reference picture index with a second context (ctx1),
decode a third bin (bin2) of the reference picture index with a third context (ctx2), and
wherein to decode at least another bin of the reference picture index value with the bypass coding mode, the instructions cause the one or more processors to:
decode all remaining bins after the third bin (bin2) with the bypass coding mode.

83. The computer-readable medium of claim 76,
wherein to decode at least one bin of the reference picture index value with the context coding mode, the instructions cause the one or more processors to:
decode a first bin (bin0) of the reference picture index value with a first context (ctx0), and
wherein to decode at least another bin of the reference picture index value with the bypass coding mode, the instructions cause the one or more processors to:
decode all remaining bins after the first bin (bin0) with the bypass coding mode.

84. The computer-readable medium of claim 76,
wherein to decode the at least one bin of the reference picture index value with the context coding mode, the instructions cause the one or more processors to:
decode at least one bin of the unary coded reference picture index value with the context coding mode;
wherein to decode the at least another bin of the index value with the bypass coding mode, the instructions cause the one or more processors to:
decode at least another bin of the unary coded reference picture index value with the bypass coding mode; and
wherein to binarize the reference picture index value, the instructions cause the one or more processors to unary code the reference picture index value.

85. The computer-readable medium of claim 84, wherein to unary code the reference picture index value, the instructions cause the one or more processors to truncated unary code the reference picture index value.

86. The computer-readable medium of claim 76,
wherein to decode the at least one bin of the reference picture index value with the context coding mode, the instructions cause the one or more processors to:
decode at least one bin of a unary coded portion of the reference picture index value with the context coding mode;
wherein to decode the at least another bin of the reference picture index value with the bypass coding mode, the instructions cause the one or more processors to:
decode at least another bin of the unary coded portion of the reference picture index value and an exponential-Golomb coded portion of the reference picture index value with the bypass coding mode; and
wherein to binarize the reference picture index value, the instructions cause the one or more processors to unary code and exponential-Golomb code the reference picture index value.

87. The computer-readable medium of claim 86, further comprising instructions that cause the one or more processors to truncate the exponential-Golomb coded portion of the reference picture index value prior to decoding the exponential-Golomb coded portion of the reference picture index value.

88. The computer-readable medium of claim 76,
wherein to decode the at least one bin of the reference picture index value with the context coding mode, the instructions cause the one or more processors to decode at least one bin of a unary coded portion of the reference picture index value with the context coding mode;
wherein to decode the at least another bin of the reference picture index value with the bypass coding mode, the instructions cause the one or more processors to decode at least another bin of the unary coded portion reference picture index value and a fixed length coded portion of the reference picture index value with the bypass coding mode; and wherein to binarize the reference picture index value, the instructions cause the one or more processors to unary code and fixed length code the reference picture index value.

89. The computer-readable medium of claim 88, further comprising instructions that cause the one or more processors to truncate the fixed length coded portion of the reference picture index value prior to coding the fixed length coded portion of the reference picture index value.

90. The computer-readable medium of claim 76,
   wherein to decode with the context coding mode, the instructions cause the one or more processors to select one or more probability models for coding the at least one bin of the binarized reference picture index and decode the at least one bin of the binarized reference picture index using the selected one or more probability models; and
   wherein to decode with the bypass coding mode, the instructions cause the one or more processors to determine a fixed probability and decode the at least another bin of the binarized reference picture index value using the fixed probability.

91. The computer-readable medium of claim 76, further comprising instructions that cause the one or more processors to:
   decode a first bin of an inter-prediction direction syntax element with a context coding mode of the CABAC process; and
   decode a second bin of the inter-prediction direction syntax element with a bypass coding mode of the CABAC process.

* * * * *